(12) United States Patent
Sugasaki et al.

(10) Patent No.: US 7,108,952 B2
(45) Date of Patent: Sep. 19, 2006

(54) PHOTOPOLYMERIZABLE COMPOSITION

(75) Inventors: Atsushi Sugasaki, Shizuoka (JP); Kazuto Kunita, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 269 days.

(21) Appl. No.: 10/376,257

(22) Filed: Mar. 3, 2003

(65) Prior Publication Data
US 2003/0207204 A1 Nov. 6, 2003

(30) Foreign Application Priority Data
Mar. 1, 2002 (JP) .......................... P.2002-055881

(51) Int. Cl.
*G03F 7/04* (2006.01)
(52) U.S. Cl. .................... 430/270.1; 522/104; 522/150
(58) Field of Classification Search ................ 526/257, 526/319, 341, 287, 297; 430/270.1, 910
See application file for complete search history.

(56) References Cited

U.S. PATENT DOCUMENTS

| 2,850,445 A | 9/1958 | Oster |
| 4,708,925 A | 11/1987 | Newman |

FOREIGN PATENT DOCUMENTS

| EP | 1 091 247 A2 | 4/2001 |
| EP | 1 249 731 A2 | 10/2002 |
| JP | 44-20189 | 8/1969 |
| JP | 8-276558 | 10/1996 |
| JP | 2001031983 | * 2/2001 |

OTHER PUBLICATIONS

Chemical Abstract 134:133979 for JP 2001031983, Feb. 2001.*
European Search Report dated May 21, 2003.

* cited by examiner

*Primary Examiner*—Rosemary Ashton
(74) *Attorney, Agent, or Firm*—Sughrue Mion, PLLC

(57) ABSTRACT

A photopolymerizable composition comprising a polymer having a radical polymerizable group and a unit represented by the following formula (I):

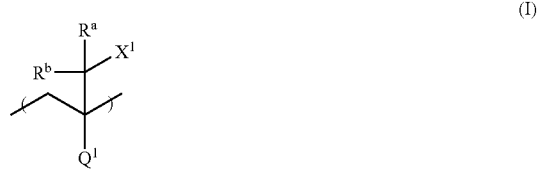

(I)

wherein $Q^1$ represents a cyano group or $COX^2$; $X^1$ and $X^2$ each independently represent —R— or a halogen atom, R represents a hetero atom; $R^a$ and $R^b$ each independently represent a hydrogen atom, a halogen atom, a cyano group or an organic residual group; $X^1$ and $X^2$ may be taken together to form a cyclic structure; $R^a$ and $R^b$ may be taken together to form a cyclic structure; and $X^1$ and $R^a$ or $R^b$ may be taken together to form a cyclic structure.

15 Claims, No Drawings

PHOTOPOLYMERIZABLE COMPOSITION

FIELD OF THE INVENTION

This invention relates to a photopolymerizable composition useful in stereolithography, holography, image forming materials, such as lithographic printing plate precursors, color proofs, photoresists, and color filters, and photocuring resin materials including inks, coatings, and adhesives. It particularly relates to a photopolymerizable resin composition suited for use in a lithographic printing plate precursor capable of direct platemaking based on digital data from a computer, etc. (direct-to-plate) by use of various lasers.

BACKGROUND OF THE INVENTION

Solid state lasers, semiconductor lasers, and gas lasers emitting light from infrared to ultraviolet wavelengths (300 to 1200 nm) have come to be easily available with high output and compact sizes. These lasers are very useful as a light source in direct-to-plate digital systems.

A diversity of studies have been undertaken on recording materials sensitive to various lasers. Recording materials hereinafter proposed typically include those writable with infrared laser light having wavelengths of 760 nm or longer, such as the positive-working material disclosed in U.S. Pat. No. 4,708,925 and the negative-working material of acid catalyst-induced crosslinking type disclosed in JP-A-8-276558 (The term "JP-A" as used herein means an "unexamined published Japanese patent application"); and those writable with ultraviolet or visible laser light having wavelengths of 300 to 700 nm, such as the radical polymerizable, negative-working materials disclosed in U.S. Pat. No. 2,850,445 and JP-B-44-20189 (the term "JP-B" as used herein means an "examined Japanese patent publication").

On the other hand, recording materials sensitive to short wavelengths of 300 nm or shorter and electron rays are specially important as a photoresist material. With the recent increase in integrity of integrated circuits, micro-patterning technology achieving half micron or finer line widths has been demanded in the fabrication of semiconductor substrates for VLSIs, etc. To meet the demand, the wavelengths of aligners used in photolithography have been getting shorter and shorter. Use of far ultraviolet light or excimer laser light (e.g., XeCl, KrF or ArF) has been attempted, and supermicro-patterning with an electron beam has now come to be studied. In particular, an electron beam is a promising light source for patterning technology of next generation.

Performance requirements common to all these image-forming materials are film strength, storage stability, and high sensitivity of a photosensitive layer. Recording materials for lithographic printing plates are especially required to have high film strength for assuring press life. However, it is difficult to satisfy all the requirements for film strength, storage stability and sensitivity. State-of-the art image-forming materials have not shown sufficiently satisfactory results, waiting for development of innovative techniques.

SUMMARY OF THE INVENTION

An object of the present invention is to provide a photopolymerizable composition, particularly a photo-radical polymerizable composition promising in imaging technology for its highest sensitivity, which provides a photosensitive layer excellent in all of film strength, storage stability and sensitivity. The object is particularly to provide a photopolymerizable composition specially suited to fabricate a lithographic printing plate precursor capable of direct writing with a solid state laser or a semiconductor laser emitting ultraviolet light, visible right or infrared light based on digital data from a computer, etc., the photosensitive layer of which is excellent in storage stability and sensitivity and provides a cured film with an extended press life.

As a result of extensive investigation, the present inventors have found that the above object is accomplished by using a polymer prepared by polymerizing a specific monomer.

The present invention provides a photopolymerizable composition containing a polymer having a radical polymerizable group and a unit represented by formula (I):

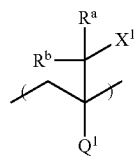

(I)

wherein $Q^1$ represents a cyano group or $COX^2$; $X^1$ and $X^2$ each represent —R— or a halogen atom, R represents a hetero atom; $R^a$ and $R^b$ each represent a hydrogen atom, a halogen atom, a cyano group or an organic residual group; $X^1$ and $X^2$ may be taken together to form a cyclic structure; $R^a$ and $R^b$ may be taken together to form a cyclic structure; and $X^1$ and $R^a$ or $R^b$ may be taken together to form a cyclic structure.

Acrylic esters, acrylamides, methacrylic esters, and methacrylamides have been employed as monomers providing polymeric binders because of their generally high polymerizability. On the other hand, monomers having poor polymerizability include itaconic esters and styrene monomers.

In applications requiring high film strength, such as printing plates, monomers are required to provide polymers of high molecular weights. From this viewpoint, highly polymerizable acrylic or methacrylic monomers are preferred. However, polymeric binders prepared from acrylic or methacrylic monomer systems tend to have poorer compatibility with low-molecular components with increasing molecular weights. While it is preferable for improving sensitivity to add a crosslinkable monomer (low-molecular component) in an increased proportion, a photopolymerizable composition containing such an increased amount of a low-molecular component tends to have poor storage stability because the low-molecular component is liable to separate due to insufficient compatibility of the binder.

α-Hetero-substituted methyl acrylates are known to be comparable to acrylic monomers in polymerizability. The present inventors prepared polymers comprising a unit derived from an α-hetero-substituted methyl acrylate having a radical polymerizable group introduced thereto and ascertained that the polymers hardly induce separation of a crosslinking monomer (a low-molecular component) added in an increased amount and exhibit higher sensitivity than the photopolymerizable compositions of related arts. While the reasons have not been elucidated, it is considered that steric hindrance by the α-heteromethyl structure and the ester or amide structure incorporated into the polymer main chain prevents agglomeration of polymer molecules and that the α-hetero moiety is effective in enhancing the interaction with a low-molecular compound, resulting in increased effects of radical polymerization.

DETAILED DESCRIPTION OF THE INVENTION

The polymer characteristic of the present invention has a radical polymerizable group and the unit represented by formula (I) [hereinafter simply referred to as the unit (I)]. In other words, it is a polymer resulting from polymerization at an unsaturated double bond adjacent to $Q^1$.

The unit (I) may be either in the form of a monovalent substituent or in the form of a single compound with all of $R^a$, $R^b$, $X^1$, and $X^2$ having an end group.

The polymer of the invention is divided into the following three types according to the position of a radical polymerizable group.
(A) A type having a radical polymerizable group introduced into $X^1$.
(B) A type having a radical polymerizable group introduced into $Q^1$.
(C) A type having a radical polymerizable group introduced into a comonomer unit other than the unit (I).

The polymer of the invention preferably contains a comonomer unit having an alkali-soluble group. The alkali-soluble group includes a carboxyl group, a phenoxy group, and a sulfamoyl group.

The polymer is preferably of the type (A) or (B), still preferably of the type (A). The polymer of the type (C) preferably has a cyclic structure in the unit (I). The polymer may comprise both a type (A) unit and a type (B) unit.

The radical polymerizable group which can be used in the invention is preferably one having at least one ethylenically unsaturated double bond. Such a radical polymerizable group is widely known in the art, and any known radical polymerizable group can be used in the invention with no particular limitation. The radical polymerizable group includes functional groups of acrylic ester type, methacrylic ester type or styrene type.

In formula (I), $Q^1$ represents a cyano group (CN) or a group of formula $COX^2$. $X^1$ and $X^2$ each represent a hetero atom or a halogen atom. $X^1$ and $X^2$ may function as an end group or a linking group. The hetero atom is preferably a nonmetallic atom, e.g., oxygen, sulfur, nitrogen or phosphorus. The halogen atom includes chlorine, bromine, iodine, and fluorine.

$X^1$ is preferably a halogen atom or a linking group to which another substituent is bonded to form a hydroxyl group, a substituted oxy group, a mercapto group, a substituted thio group, an amino group, a substituted amino group, a sulfo group, a sulfonate group, a substituted sulfinyl group, a substituted sulfonyl group, a phosphono group, a substituted phosphono group, a phosphonate group, a substituted phosphonate group, a nitro group or a heterocyclic group bonded at the hetero atom thereof.

$X^2$ is preferably a halogen atom or a linking group to which another substituent is bonded to form a hydroxyl group, a substituted oxy group, a mercapto group, a substituted thio group, an amino group, a substituted amino group or a heterocyclic group bonded at the hetero atom thereof.

$X^1$ or $X^2$ may be each a linking group to which another substituent is bonded.

$X^1$ and $X^2$ may be connected together to form a cyclic structure.

$R^a$ and $R^b$ each preferably represent a hydrogen atom, halogen atom, a cyano group, a substituted or unsubstituted and saturated or unsaturated hydrocarbon group, a substituted oxy group, a substituted thio group, a substituted amino group, a substituted carbonyl group or a carboxylate group. $R^a$ and $R^b$ may be connected together to form a cyclic structure.

The above-recited substituents in $X^1$, $X^2$, $R^a$ and $R^b$ will be described in more detail.

The substituted or unsubstituted and saturated or unsaturated hydrocarbon group includes an alkyl group, a substituted alkyl group, an aryl group, a substituted aryl group, an alkenyl group, a substituted alkenyl group, an alkynyl group, and a substituted alkynyl group.

The alkyl group includes a straight-chain, branched or cyclic alkyl group having 1 to 20 carbon atoms, such as methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, t-butyl, isopentyl, neopentyl, 1-methylbutyl, isohexyl, 2-ethylhexyl, 2-methylhexyl, cyclohexyl, cyclopentyl, and 2-norbornyl. Preferred of them are straight-chain ones having 1 to 12 carbon atoms, branched ones having 3 to 12 carbon atoms, and cyclic ones having 5 to 10 carbon atoms.

The substituted alkyl group is composed of an alkylene group and, as a substituent, a monovalent non-metallic atom or atomic group (except hydrogen) bonded to the alkylene group. Preferred substituents include a halogen atom (e.g., —F, —Br, —Cl or —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, ureido, N'-alkylureido, N,N'-dialkylureido, N'-arylureido, N'N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl -N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, acyl, carboxyl and its conjugated base (hereinafter referred to as carboxylato) alkoxycarbonyl, aryloxycarbonyl, carbamoyl, N-alkylcarbamoyl, N,N-dialkylcarbamoyl, N-arylcarbamoyl, N,N-diarylcarbamoyl, N-alkyl-N-arylcarbamoyl, alkylsulfinyl, arylsulfinyl, alkylsulfonyl, arylsulfonyl, sufo (—$SO_3H$) and its conjugated base (hereinafter referred to as sulfonato), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, N-acylsulfamoyl and its conjugated base, N-alkylsulfonylsulfamoyl [—$SO_2NHSO_2$(alkyl)] and its conjugated base, N-arylsulfonylsulfamoyl [—$SO_2NHSO_2$(aryl)] and its conjugated base, N-alkylsulfonylcarbamoyl [—$CONHSO_2$(alkyl)] and its conjugated base, N-arylsulfonylcarbamoyl [—$CONHSO_2$(aryl)] and its conjugated base, alkoxysilyl [—$Si(O$-alkyl$)_3$], aryloxysilyl [—$Si(O$-aryl$)_3$], hydroxysilyl [—$Si(OH)_3$)] and its conjugated base, phosphono (—$PO_3H_2$) and its conjugated base (hereinafter referred to as phosphonato), dialkylphosphono [—$PO_3$(alkyl)$_2$], diarylphosphono [—$PO_3$(aryl)$_2$], alkylarylphosphono [—$PO_3$(alkyl)(aryl)], monoalkylphosphono [—$PO_3H$(alkyl)] and its conjugated base (hereinafter referred to as alkylphosphonato) monoarylphosphono

[—PO₃H(aryl)] and its conjugated base (hereinafter referred to as arylphosphonato), phosphonoxy (—OPO₃H₂) and its conjugated salt (hereinafter referred to as phosphonatoxy), dialkylphosphonoxy [—OPO₃(alkyl)₂], diarylphosphonoxy [—OPO₃(aryl)₂], alkylarylphosphonoxy [—OPO₃ (alkyl) (aryl)], monoalkylphosphoxy [—OPO₃H (alkyl)] and its conjugated base (hereinafter referred to as alkylphosphonatoxy), monoarylphosphonoxy [—OPO₃H(aryl)] and its conjugated base (hereinafter referred to as arylphosphonatoxy), cyano, nitro, aryl, alkenyl, and alkynyl.

The alkyl moiety of these substituents includes the aforementioned alkyl groups. The aryl group or moiety of these substituents include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl, and phosphonatophenyl. The alkenyl group includes vinyl, 1-propenyl, 1-butenyl, cinnamyl, and 2-chloro-1-ethenyl. The alkynyl group includes ethynyl, 1-propynyl, 1-butynyl, trimethylsilylethynyl, and phenylethynyl.

The acyl group or moiety is represented by R⁴CO—, wherein R⁴ is a hydrogen atom or the above-recited alkyl, aryl, alkenyl or alkynyl group.

The alkylene group in the substituted alkyl group includes the above-recited alkyl groups having 1 to 20 carbon atoms with any one of their hydrogen atoms removed to become a divalent organic residual group, preferably a straight-chain alkylene group having 1 to 12 carbon atoms, a branched alkylene group having 3 to 12 carbon atoms, and a cyclic alkylene group having 5 to 10 carbon atoms. Examples of preferred substituted alkyl groups are chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

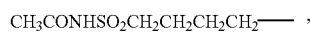

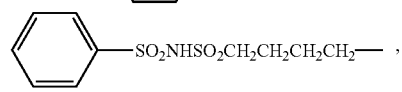

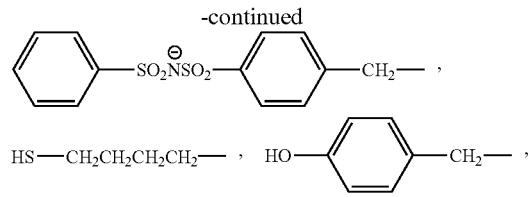

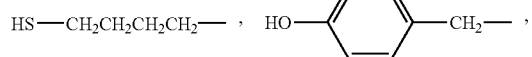

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamoyl, allyl, 1-propenylmethyl, 2-butenyl, 2-methylallyl, 2-methylpropenylmethyl, 2-propynyl, 2-butynyl, and 3-butynyl.

The aryl group includes a phenyl group; a condensed ring made of two or three benzene rings, such as naphthyl, anthryl, phenanthryl or acenaphthenyl; and a condensed ring made of a benzene ring and a 5-membered unsaturated ring, such as indenyl or fluorenyl; with phenyl and naphthyl being preferred.

The substituted aryl group is composed of an arylene group and, as a substituent, a monovalent non-metallic atom or atomic group (except hydrogen) bonded to the arylene group. The arylene group includes one derived from the above-described aryl groups. Preferred substituents include the above-recited substituted or unsubstituted alkyl groups and those recited above as a substituent on substituted alkyl groups. Examples of preferred substituted aryl groups are biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allyl, 1-propenylmethyl, 2-butenyl, 2-methylallylphenyl 2-methylpropenylphenyl, 2-propynylphenyl, 2-butynylphenyl, and 3-butynylphenyl.

The alkenyl group includes those recited above. The substituted alkenyl group is an alkenyl group with its hydrogen displaced with a substituent. The substituent of the substituted alkenyl group includes the substituents enumerated above as for the substituted alkyl group. The alkenyl moiety of the substituted alkenyl group includes those recited above. Examples of preferred substituted alkenyl groups are:

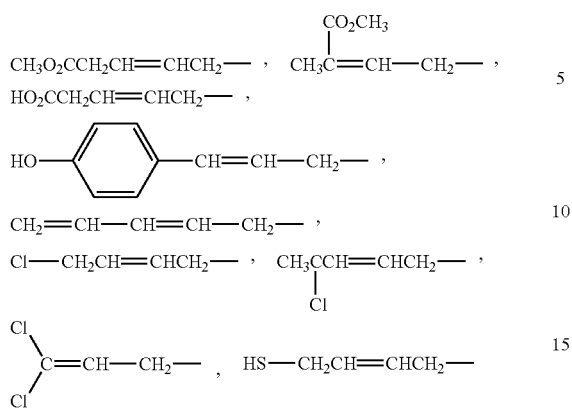

The alkynl group includes those described above. The substituted alkynyl group is an alkynyl group with its hydrogen displaced with a substituent. The substituent of the substituted alkynyl group includes those recited above with respect to the substituted alkyl group, and the alkynyl moiety of the substituted alkynyl group includes the above-described ones.

The heterocyclic group is a monovalent group derived by removing one hydrogen atom from a hetero ring or the monovalent group with its another hydrogen atom displaced with a substituent (i.e., a substituted heterocyclic group). Examples of preferred heterocyclic groups are shown below.

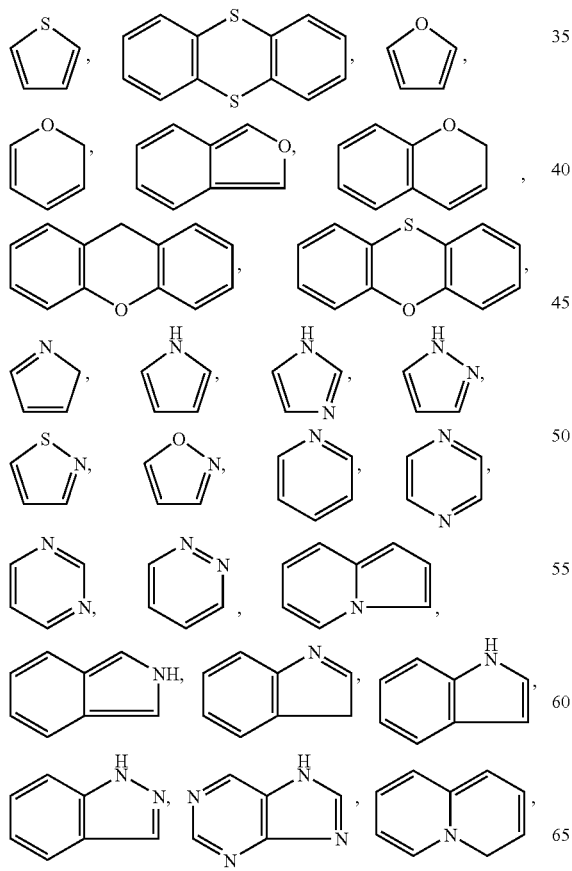

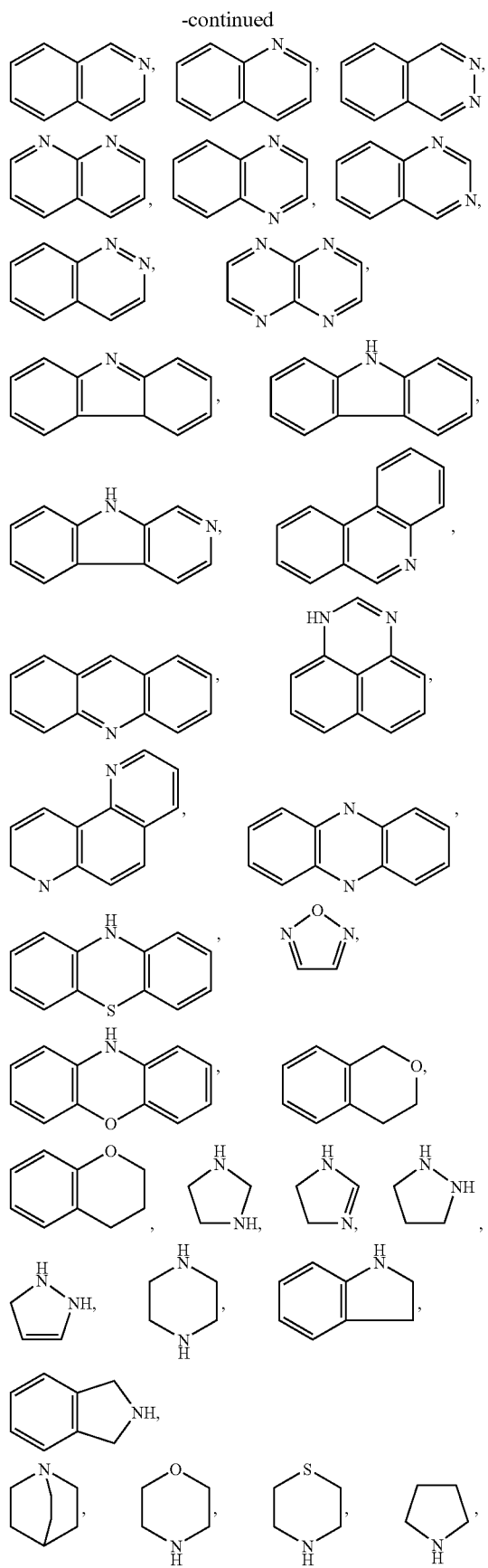

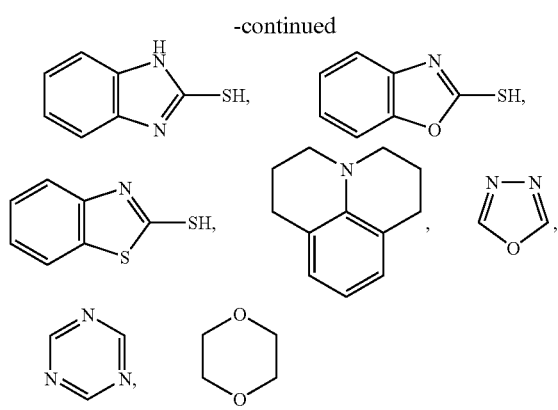

The substituted oxy group is represented by R⁵O—, wherein R⁵ is a monovalent non-metal atomic group except hydrogen. Preferred substituted oxy groups include alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy, and phosphonatoxy. The alkyl moiety and the aryl moiety in these substituents include the above-described substituted or unsubstituted alkyl groups and substituted or unsubstituted aryl groups. The acyl moiety of the acyloxy group is represented by R⁶CO—, wherein R⁶ includes the above-described substituted or unsubstituted alkyl groups and substituted or unsubstituted aryl groups. Preferred of these substituted oxy groups are alkoxy, aryloxy, acyloxy, and arylsulfoxy. Examples of preferred substituted oxy groups are methoxy, ethoxy, propoxy, isopropoxy, butoxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy, and phosphonatoxy.

The substituted thio group is represented by R⁷S—, wherein R⁷ is a monovalent non-metal atomic group except hydrogen. Preferred substituted thio groups include alkylthio, arylthio, alkyldithio, aryldithio, and acylthio. The alkyl moiety and the aryl moiety of the substituted thio groups include the above-described substituted or unsubstituted alkyl groups and substituted or unsubstituted aryl groups. The acyl moiety of the acylthio group includes those described above as R⁶CO—. Preferred of these substituted thio groups are alkylthio and arylthio. Examples of preferred substituted thio groups include methylthio, ethylthio, phenylthio, ethoxyethylthio, carboxyethylthio, and methoxycarbonylthio.

The substituted amino group is represented by R⁸NH— or (R⁹(R¹⁰)N—, wherein R⁸, R⁹, and R¹⁰ each represent a monovalent non-metallic substituent except hydrogen. Examples of the substituted amino group are N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, and N-aryl-N-aryloxycarbonylamino.

The alkyl moiety and the aryl moiety in the substituted amino groups include the above-described substituted or unsubstituted alkyl groups and substituted or unsubstituted aryl groups. The acyl moiety in the acyl amino, N-alkylacylamino, and N-arylacylamino groups is represented by R⁶CO—, wherein R⁶ is as defined above.

Preferred of the substituted amino groups are N-alkylamino, N,N-dialkylamino, N-arylamino, and acylamino. Examples of the preferred substituted amino groups are methylamino, ethylamino, diethylaino, morpholino, piperidino, pyrrolidino, phenylamino, benzoylamino, and acetylamino.

The substituted carbonyl group is represented by R¹¹—CO—, wherein R¹¹ is a monovalent non-metal atomic group. Preferred substituted carbonyl groups include acyl (inclusive of formyl), carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl, and N-alkyl-N-arylcarbamoyl. The alkyl and aryl moieties in these substituted carbonyl groups include the above-described substituted or unsubstituted alkyl and substituted or unsubstituted aryl groups. Still preferred substituted carbonyl groups are acyl (inclusive of formyl), carboxyl, alkoxycarbonyl, aryloxycarbonyl, carbamoyl, N-alkylcarbamoyl, N,N-dialkylcarbamoyl, and N-arylcarbamoyl. Particularly preferred of them are acyl (inclusive of formyl), alkoxycarbonyl and aryloxycarbonyl. Examples of the preferred substituted carbonyl groups are formyl, acetyl, benzoyl, carboxyl, methoxycarbonyl, allyloxycarbonyl, N-methyl carbamoyl, N-phenylcarbamoyl, N,N-diethylcarbamoyl, and morpholinocarbonyl.

The substituted sulfinyl group is represented by R¹²—SO—, wherein R¹² is a monovalent non-metal atomic group. Examples of preferred substituted sulfinyl groups are alkylsulfinyl, arylsulfinyl, sulfinamoyl, N-alkylslfinamoyl, N,N-dialkylsulfinamoyl, N-arylsulfinamoyl, N,N-diarylsulfinamoyl, and N-alkyl-N-arylsulfinamoyl. The alkyl and aryl moieties in these substituted sulfinyl groups include the above-described substituted or unsubstituted alkyl groups and substituted or unsubstituted aryl groups. Still preferred substituted sulfinyl groups are alkylsulfinyl and arylsulfinyl, such as hexylsulfinyl, benzylsulfinyl, and tolylsulfinyl.

The substituted sulfonyl group is represented by R¹³—SO₂—, wherein R¹³ is a monovalent non-metal atomic group. Alkylsulfonyl and arylsulfonyl are preferred. The alkyl moiety and aryl moiety include the above-described substituted or unsubstituted alkyl groups and substituted or unsubstituted aryl groups. Examples of the substituted sulfonyl groups are butylsulfonyl and chlorophenylsulfonyl.

The sulfonato group ($—SO_3^-$) is a conjugated base anion of a sulfo group ($—SO_3H$) as defined supra, which is usually used as combined with a counter cation. Generally known cations can be used, such as various onium (e.g., ammonium, sulfonium, phosphonium, iodonium, azinium) ions and metal ions (e.g., $Na^+$, $K^+$, $Ca^{2+}$, $Zn^{2+}$).

The carboxylato group ($—CO_2^-$) is a conjugated base anion of a carboxyl group (COOH) as defined supra, which is usually used as combined with a counter cation. Generally known cations can be used, such as various onium (e.g., ammonium, sulfonium, phosphonium, iodonium, azinium) ions and metal ions (e.g., $Na^+$, $K^+$, $Ca^{2+}$, $Zn^{2+}$).

The substituted phosphono group is a phosphono group with one or two of the hydroxyl groups thereof substituted with organic oxo group(s). Preferred substituted phosphono groups include the above-recited dialkylphosphono, diarylphosphono, alkylarylphosphono, monoalkylphosphono, and monoarylphosphono. Dialkylphosphono and diarylphosphono, such as diethylphosphono, dibutylphosphono, and diphenylphosphono, are still preferred.

The phosphonato group ($—PO_3^{2-}$ or $—PO_3H^-$) is a conjugated base anion derived by the first or second dissociation of a phosphono group ($—PO_3H_2$) as described supra, which is usually used with a counter cation. Generally known cations are used, such as various onium (e.g., ammonium, sulfonium, phosphonium, iodonium, azinium) ions and metal ions (e.g., $Na^+$, $K^+$, $Ca^{2+}$, $Zn^{2+}$).

The substituted phosphonato group is a conjugated base anion derived from the above-recited substituted phosphono group by displacing one hydroxyl group thereof with an organic oxo group. Examples are conjugated bases of the above-described monoalkylphosphono [$—PO_3H(alkyl)$] and monoarylphosphono [$—PO_3H(aryl)$]. They are usually preferably used in combination with counter cations. Generally known cations, such as various onium (e.g., ammonium, sulfonium, phosphonium, iodonium, azinium) ions and metal ions (e.g., $Na^+$, $K^+$, $Ca^{2+}$, $Zn^{2+}$), can be used.

The cyclic structures formed between $X^1$ and $X^2$, between $R^a$ and $R^b$, between $X^1$ and $R^a$, and between $X^1$ and $R^b$ include 5- to 8-membered aliphatic rings, preferably 5- or 6-membered aliphatic rings. They may have a substituent on the ring-forming carbon atom. Useful substituents include those of the aforementioned substituted alkyl group. Part of the ring-forming carbon atoms may be displaced with a hetero atom (e.g., O, S or N). Part of the aliphatic ring may be part of an aromatic ring.

Specific examples of the polymer having the unit (I) are shown below.

TABLE 1

PA Group - Polymers with Radical Polymerizable Group on X$^1$

| No. | X$^1$ | Q$^1$ |
|---|---|---|
| PA-1 | (structure) | COOCH$_3$ |
| PA-2 | (structure) | COOCH$_2$CH$_3$ |
| PA-3 | (structure) | COOCH$_3$ |
| PA-4 | (structure) | COOCH$_2$CH$_3$ |
| PA-5 | (structure) | COOCH$_3$ |

TABLE 1-continued

PA Group - Polymers with Radical Polymerizable Group on X¹

| No. | X¹ | Q¹ |
|---|---|---|
| PA-6 | (pyrrole with two CH₂-OCO-C(CH₃)=CH₂ groups) | -COO-CH₂CH₂-C₆H₅ |
| PA-7 | (norbornane with -CO₂- linker to -CH₂CH₂-O₂C-C(CH₃)=CH₂) | -O-CH(C₂H₅)(C₅H₁₁) |
| PA-8 | (piperidine-4-yl with -CO₂-(CH₂)₃-OCO-C(CH₃)=CH₂) | COOCH₃ |
| PA-9 | (cyclopentane with -OCO- and -CH₂CH₂-OCO-C(CH₃)=CH₂) | COOCH₂CH₃ |
| PA-10 | (naphthalene-2,6-diyl with -OCO-C(CH₃)=CH₂ and -OCO-) | -OOC-C₆H₄-CH₃ |

TABLE 1-continued

PA Group - Polymers with Radical Polymerizable Group on $X^1$ $$\text{---CH}_2\text{---C}(X^1)(Q^1)\text{---} \quad (2)$$

| No. | $X^1$ | $Q^1$ |
|---|---|---|
| PA-11 | —OCO—CH$_2$CH$_2$—O—CH$_2$CH$_2$—OCO—C(CH$_3$)=CH$_2$ | COOCH$_3$ |
| PA-12 | —OCO—(CH$_2$)$_8$—OCO—C(CH$_3$)=CH$_2$ | CONH—CH$_2$CH$_2$—OH |
| PA-13 | —NHCO—(CH$_2$)$_8$—OCO—C(CH$_3$)=CH$_2$ | COOCH$_3$ |
| PA-14 | —OCO—CH$_2$CH$_2$—O—(p-C$_6$H$_4$)—O—CH$_2$CH$_2$—OCO—C(CH$_3$)=CH$_2$ | COOCH$_3$ |
| PA-15 | —CH$_2$—N(CH$_3$)—(p-C$_6$H$_4$)—OCO—C(CH$_3$)=CH$_2$ | COOCH$_3$ |
| PA-16 | —NHCO—(p-C$_6$H$_4$)—OOC—(CH$_2$)$_3$—OCO—C(CH$_3$)=CH$_2$ | COOCH$_2$CH$_3$ |

TABLE 1-continued

PA Group - Polymers with Radical Polymerizable Group on X¹

| No. | X¹ | Q¹ |
|---|---|---|
| PA-17 | (structure: 1,3,5-tris(isopropenyloxycarbonyloxy)benzene) | COOCH₃ |
| PA-18 | (structure: N-linked chain with two isopropenyloxycarbonyloxy groups) | COOCH₃ |
| PA-19 | (structure: N-linked chain with isopropenyloxycarbonyloxy and cyclohexyloxyethyl groups) | COOCH₂CH₃ |

TABLE 1-continued
PA Group - Polymers with Radical Polymerizable Group on X¹
| No. | X¹ | Q¹ | (2) |
|---|---|---|---|
| PA-20 | 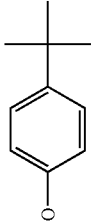 | 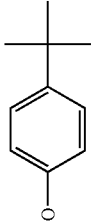 | $COOCH_2CH_3$ |
| PA-21 | 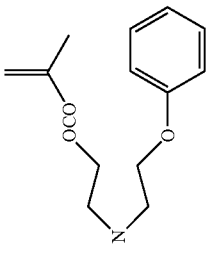 | | |

TABLE 1-continued
PA Group - Polymers with Radical Polymerizable Group on $X^1$
| No. | $X^1$ | $Q^1$ |
|---|---|---|
| PA-22 | 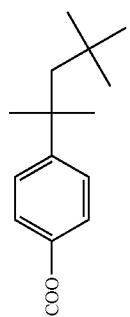 | COOCH$_3$ |
| PA-23 | 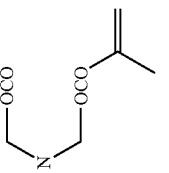 | 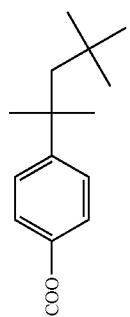 |
(2)

TABLE 1-continued

PA Group - Polymers with Radical Polymerizable Group on X¹

| No. | X¹ | Q¹ |
|---|---|---|
| PA-24 | (diisopropenyl dicarbonate structure) | 3,5-di-tert-butylphenyl-COO |
| PA-25 | 4-vinylphenyl-COO | COOCH₃ |
| PA-26 | 4-vinylphenoxyethyl-OCO | CONHCH₃ |
| PA-27 | bis(4-vinylbenzyl)amino | -COO(CH₂)₄SO₃H |
| PA-28 | 4-vinylbenzyl-O | COOCH₂CH₃ |

TABLE 1-continued
PA Group - Polymers with Radical Polymerizable Group on X¹
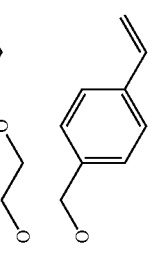
| No. | X¹ | Q¹ |
|---|---|---|
| PA-29 | 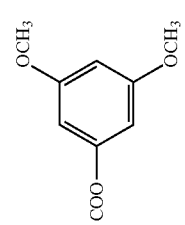 | 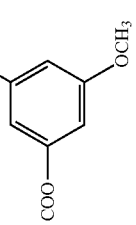 |
| PA-30 | 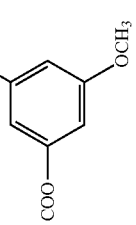 | 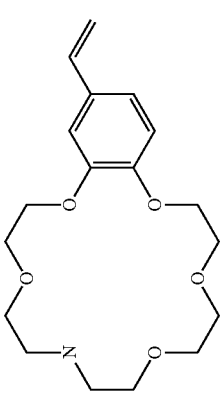 |
| PA-31 | 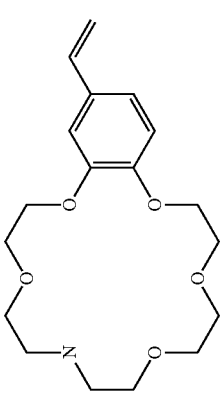 | 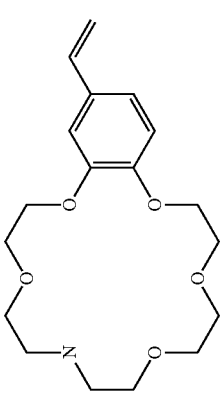 |
| PA-32 | 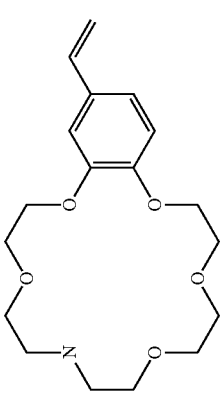 | |
| PA-33 | | COOCH₃ |

TABLE 1-continued
PA Group - Polymers with Radical Polymerizable Group on $X^1$
| No. | $X^1$ | $Q^1$ |
|---|---|---|
| PA-34 | 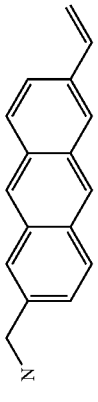 |  |
| PA-35 | —NHCO$_2$— | —COO |
| PA-36 | —NHCO$_2$— | 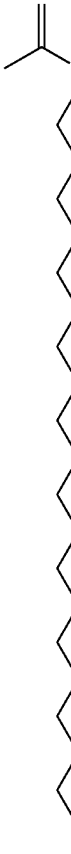—PO$_3$(C$_2$H$_5$)$_2$ |
| PA-37 | —O— | —O$^\ominus$ Na$^\oplus$ |
| PA-38 | 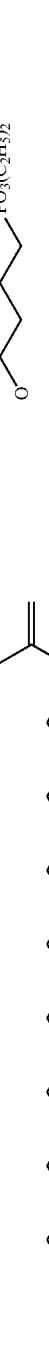 | —CONH$_2$ |

TABLE 2
PB Group - Polymers with Radical Polymerizable Group on $Q^1$
$$\text{CH}_2-\overset{X^1}{\underset{Q^1}{\text{C}}}\text{...} \quad (I)$$
| No. | $X^1$ | $Q^1$ |
|---|---|---|
| PB-1 | OH |  |
| PB-2 | OH | 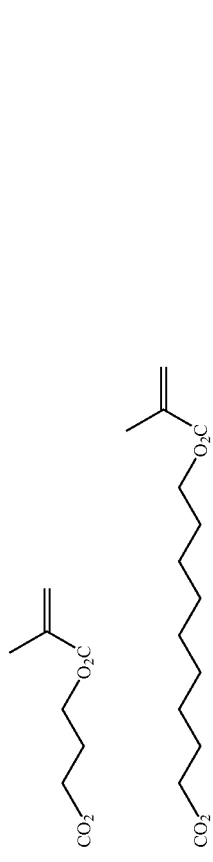 |
| PB-3 | OH |  |
| PB-4 | OH |  |
| PB-5 | —O—CH(CH$_3$)$_2$ | 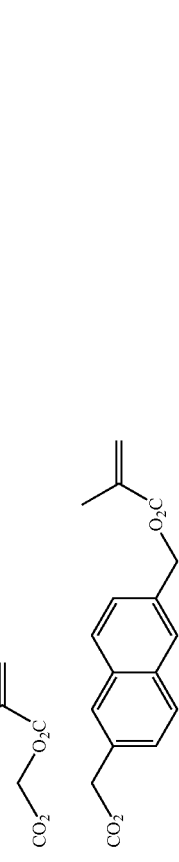 |
| PB-6 | —O—CH$_2$—CH=CH$_2$ | 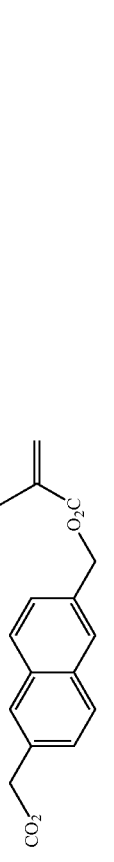 |

TABLE 2-continued
PB Group - Polymers with Radical Polymerizable Group on Q¹
| No. | X¹ | Q¹ |
|---|---|---|
| PB-7 | 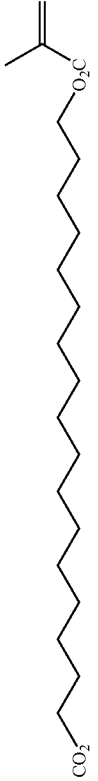 | 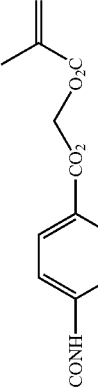 |
| PB-8 | ClCH₂CH₂O— | |
| PB-9 | OCOCH₃ | 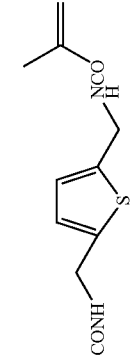 |
| PB-10 | 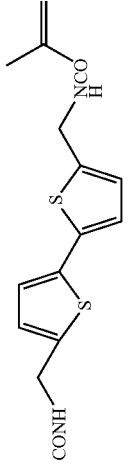 | 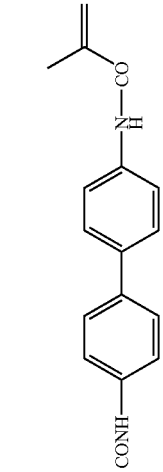 |
| PB-11 | PhOCO— | |
| PB-12 | O(n)C₈H₁₇ |  |

TABLE 2-continued

PB Group - Polymers with Radical Polymerizable Group on $Q^1$ $$\text{—CH}_2\text{—C}(X^1)(\text{—})\text{—Q}^1 \quad (I)$$

| No. | $X^1$ | $Q^1$ |
|---|---|---|
| PB-13 | $OSO_2CH_3$ | pyrene with $CONH$— and $NHCO$—C(=CH$_2$)CH$_3$ substituents |
| PB-14 | —OCH$_3$ | phenyl with $CONHSO_2$— and $OCO$—C(=CH$_2$)CH$_3$ substituents |
| PB-15 | —OCH$_3$ | phenyl with $CONHSO_2$— and $SO_2NHCO$—C(=CH$_2$)CH$_3$ substituents |
| PB-16 | —N(CH$_3$)$_2$ | 4-vinylphenyl-OCO— |
| PB-17 | SH | 4-vinylbenzyl-O— |
| PB-18 | —OCO—(CH$_2$)$_3$—OCOCH$_3$ | —CO$_2$—(CH$_2$)$_2$—OCO—(CH$_2$)$_3$—CO$_2$—C(=CH$_2$)CH$_3$ |

TABLE 2-continued

PB Group - Polymers with Radical Polymerizable Group on Q¹

| No. | X¹ | Q¹ |
|---|---|---|
| PB-19 | (N-methyl aza-crown ether structure) | —CON(CH₂CH₂O₂C-C(CH₃)=CH₂)₂ |
| PB-20 | —(CH₂)ₙ—OH | —CONH—(CH₂)₃—NHCO—O—C(CH₃)=CH₂ |
| PB-21 | —(CH₂)ₙ—OCOCH₃ | —OCO—(CH₂)₂—O—(CH₂)₂—OCO—C(CH₃)=CH₂ |
| PB-22 | —(CH₂)ₙ—NH₂ | —CONH—(CH₂)₁₀—OCO—C(CH₃)=CH₂ |
| PB-23 | —(CH₂)ₙ—OCOC₂H₅ | —COO—(CH₂)₂—OCO—C(CH₃)=CH₂ |

TABLE 2-continued

PB Group - Polymers with Radical Polymerizable Group on Q$^1$

| No. | X$^1$ | Q$^1$ |
|---|---|---|
| PB-24 | -O-CH$_2$CH$_2$-O-CH$_2$CH$_2$-O-CH$_3$ | -CH$_2$CH$_2$-OCO-C(CH$_3$)=CH$_2$ |
| PB-25 | -O-CH$_2$CH$_2$-O-CH$_2$CH$_2$-O-CH$_2$CH$_2$-O-CH$_3$ | -(CH$_2$)$_3$-OCO-C(CH$_3$)=CH$_2$ |
| PB-26 | 2-mercaptobenzoxazole (SH) | -(CH$_2$)$_5$-OCO-C(CH$_3$)=CH$_2$ |
| PB-27 | -N(CH$_2$CH$_2$OH)$_2$ | -CH$_2$CH$_2$-OCO-C(CH$_3$)=CH$_2$ |
| PB-28 | -NH$_2$ | -(CH$_2$)$_4$-OCO-C(CH$_3$)=CH$_2$ |

TABLE 3

PC Group - Polymers with Radical Polymerizable Group in Unit Copolymerized with Unit (I)

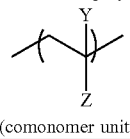

(comonomer unit)

| No. | Y | Z |
|---|---|---|
| PC-1 | CH$_3$ | CO$_2$–(CH$_2$)$_3$–O$_2$C–C(CH$_3$)=CH$_2$ |
| PC-2 | CH$_3$ | CO$_2$–(CH$_2$)$_8$–O$_2$C–C(CH$_3$)=CH$_2$ |
| PC-3 | CH$_3$ | CO$_2$–C$_6$H$_4$–O–CH$_2$CH$_2$–O$_2$C–C(CH$_3$)=CH$_2$ |
| PC-4 | CH$_3$ | CONH–C$_6$H$_4$–O$_2$C–C(CH$_3$)=CH$_2$ |
| PC-5 | CH$_3$ | CO$_2$–CH$_2$–O$_2$C–C(CH$_3$)=CH$_2$ |
| PC-6 | CH$_3$ | CO$_2$–CH$_2$–(naphthalene)–CH$_2$–O$_2$C–C(CH$_3$)=CH$_2$ |
| PC-7 | CH$_3$ | CO$_2$–(CH$_2$)$_{16}$–O$_2$C–C(CH$_3$)=CH$_2$ |
| PC-8 | CH$_3$ | CONH–C$_6$H$_4$–CO$_2$–CH$_2$–O$_2$C–C(CH$_3$)=CH$_2$ |
| PC-9 | CH$_3$ | CONH–CH$_2$–(thiophene)–CH$_2$–NH–CO–C(CH$_3$)=CH$_2$ |
| PC-10 | CH$_3$ | CONH–CH$_2$–(bithiophene)–CH$_2$–NH–CO–C(CH$_3$)=CH$_2$ |

TABLE 3-continued

PC Group - Polymers with Radical
Polymerizable Group in Unit Copolymerized with Unit (I)

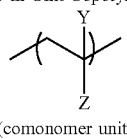

(comonomer unit)

| No. | Y | Z |
|---|---|---|
| PC-11 | H | CONH—C$_6$H$_4$—C$_6$H$_4$—N(H)—CO—C(CH$_3$)=CH$_2$ |
| PC-12 | H | CONH—CH$_2$—NHCO—C(CH$_3$)=CH$_2$ |
| PC-13 | H | CONH-pyrenyl-NHCO—C(CH$_3$)=CH$_2$ |
| PC-14 | H | CONHSO$_2$—C$_6$H$_4$—OCO—C(CH$_3$)=CH$_2$ |
| PC-15 | H | CONHSO$_2$—C$_6$H$_4$—SO$_2$NHCO—C(CH$_3$)=CH$_2$ |
| PC-16 | H | OCO—C$_6$H$_4$—CH=CH$_2$ |
| PC-17 | H | OCH$_2$—C$_6$H$_4$—CH=CH$_2$ |
| PC-18 | H | CO$_2$—(CH$_2$)$_3$—OCO—CH$_2$CH$_2$—O$_2$C—C(CH$_3$)=CH$_2$ |
| PC-19 | H | CON(CH$_2$CH$_2$—O$_2$C—C(CH$_3$)=CH$_2$)$_2$ |

TABLE 3-continued

PC Group - Polymers with Radical
Polymerizable Group in Unit Copolymerized with Unit (I)

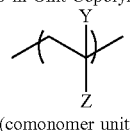

(comonomer unit)

| No. | Y | Z |
|---|---|---|
| PC-20 | H | ![structure with CONH-(CH2)3-NHCO-C(=CH2)CH3] |

The resin having the unit (I) maybe either a homopolymer of the unit (I) or a copolymer comprising the unit (I) and other unit. Suitable other units include those derived from known monomers, such as acrylic esters, methacrylic esters, acrylamides, methacrylamide, vinyl esters, styrenes, acrylic acid, methacrylic acid, acrylonitrile, maleic anhydride, and maleinimide.

The acrylic eaters include methyl acrylate, ethyl acrylate, n- or iso-propyl acrylate, n-, iso-, sec- or t-butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl)ethyl acrylate, furfuryl acrylate, tetrahydrofuryl acrylate, phenyl acrylate, chlorophenyl acrylate, and sulfamoylphenyl acrylate.

Examples of the methacrylic esters are methyl methacrylate, ethyl methacrylate, n- or iso-propyl methacrylate, n-, iso-, sec- or t-butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofuryl methacrylate, phenyl methacrylate, chlorophenyl methacrylate, and sulfamoylphenyl methacrylate.

Examples of acrylamides are acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

Examples of methacrylamides are methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylacrylamide, and N-hydroxyethyl-N-methylmethacrylamide.

Examples of the vinyl esters are vinyl acetate, vinyl butyrate, and vinyl benzoate.

Examples of the styrenes are styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

Of these comonomers particularly suitable are acrylic esters, methacrylic esters, acrylamides, methacrylamides, vinyl esters, and styrenes having 20 or fewer carbon atoms, and acrylic acid, methacrylic acid, and acrylonitrile.

The copolymer having the unit (I) may be a random copolymer, a block copolymer, a graft copolymer, etc. and is preferably a random copolymer.

Specific examples of the copolymers having the unit (I) are shown below.

P-1

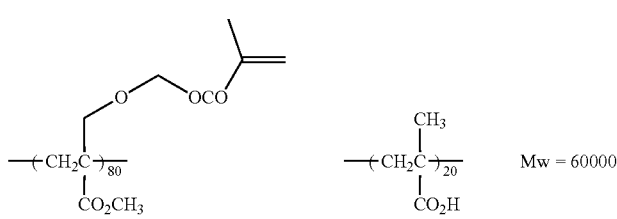

-continued
P-2
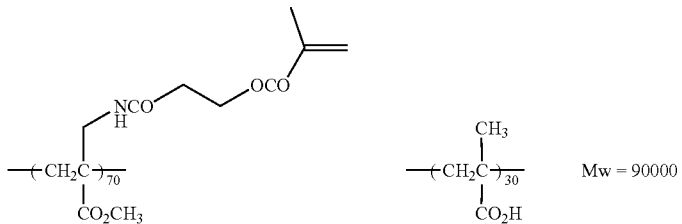
P-3
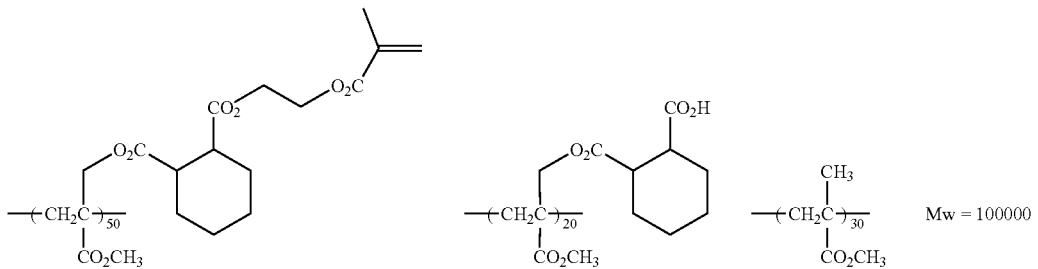
P-4
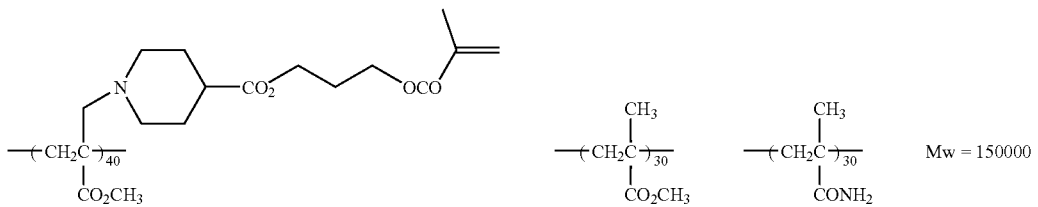
P-5
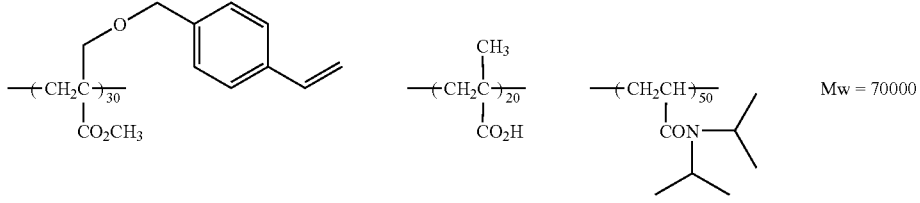
P-6
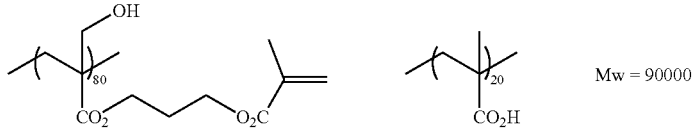
P-7
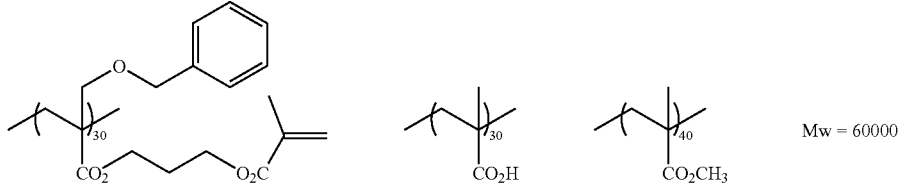
P-8
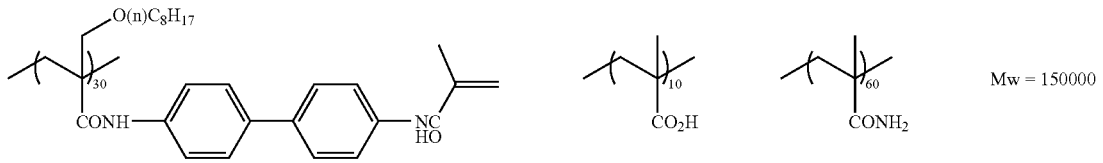
P-9
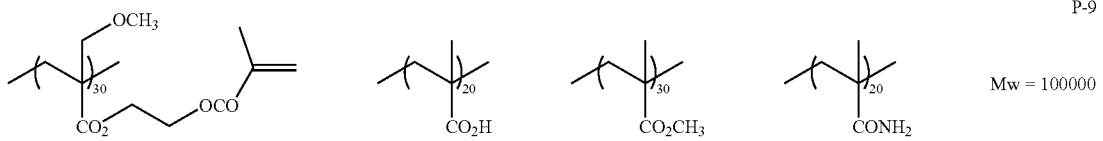

-continued
P-10
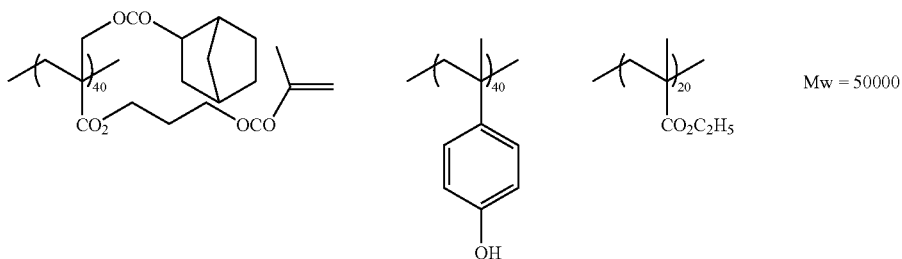 Mw = 50000
P-11
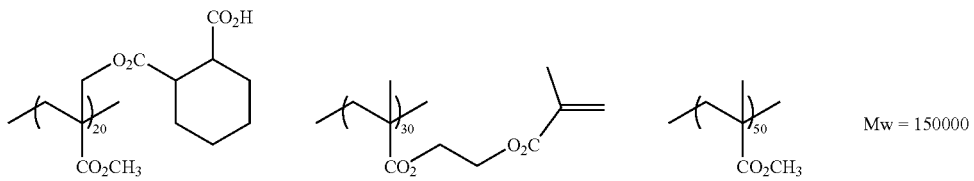 Mw = 150000
P-12
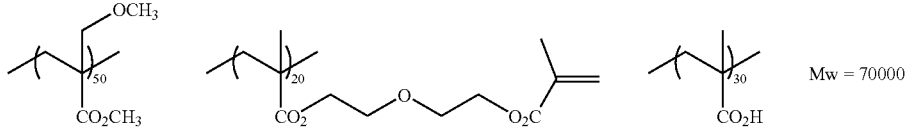 Mw = 70000
P-13
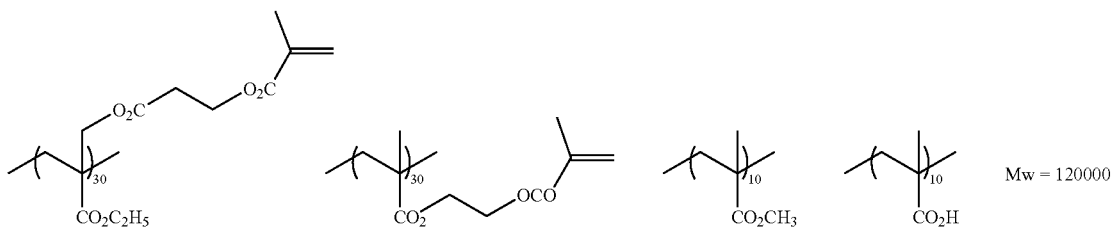 Mw = 120000
P-14
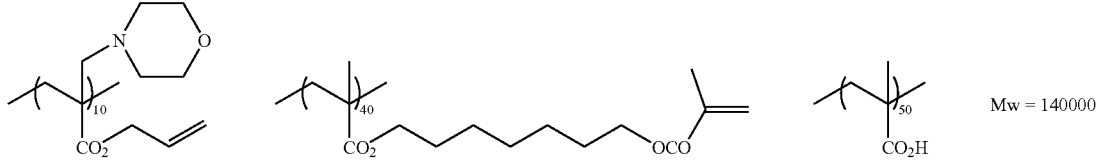 Mw = 140000
P-15
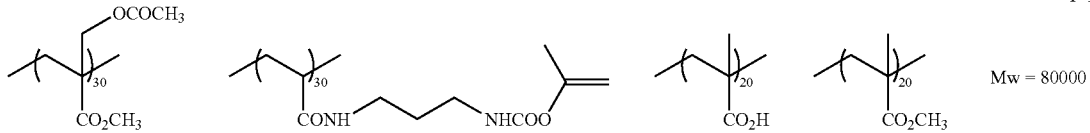 Mw = 80000
P-16
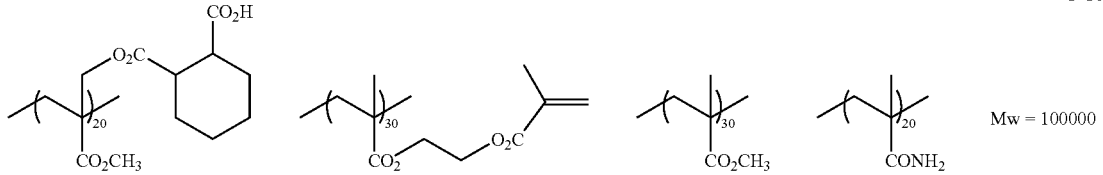 Mw = 100000
P-17
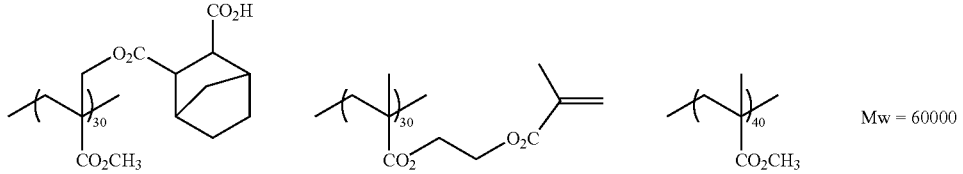 Mw = 60000

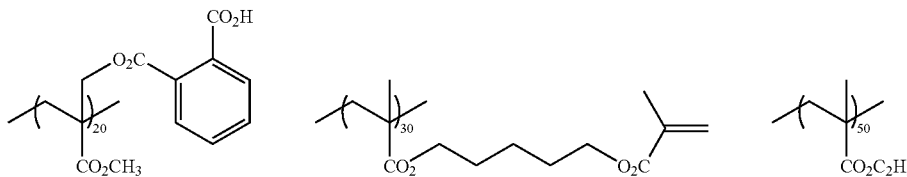

P-18

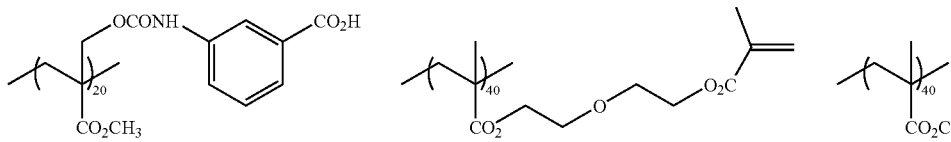

P-19

The polymer of the invention is synthesized by heating a monomer or monomers and a radical thermal polymerization initiator in an appropriate solvent.

It is preferred for the photopolymerizable composition of the invention to contain, as a binder, a linear organic polymer different from the polymer having the unit (I). Any linear organic polymer can be used as long as it exhibits compatibility with a polymerizable compound having a photopolymerizable unsaturated double bond. It is recommended to choose a linear organic polymer which is soluble in or swellable with water or a weak alkali aqueous solution and contributory to make the composition developable with water or a weakly alkaline developer. Since the linear organic polymer not only serves for film formation but governs the developability of the composition, it is chosen according to which of water, a weak alkali aqueous solution or an organic solvent is used as a plate developer. For example, use of a water-soluble organic polymer as a binder provides a film developable with water.

Water-soluble linear organic polymers include addition polymers with a carboxyl group in the side chain, such as methacrylic acid copolymers, acrylic acid copolymers, itaconic acid copolymers, crotonic acid copolymers, maleic acid copolymers, and partially esterified maleic acid copolymers, which are described in JP-A-59-44615, JP-B-54-34327, JP-B-58-12577, JP-B-54-25957, JP-A-54-92723, JP-A-59-53836, and JP-A-59-71048; acidic cellulose derivatives having a carboxyl group in the side chain; and hydroxyl-containing addition polymers having a cyclic acid anhydride added thereto. Preferred of them are copolymers comprising benzyl (meth)acrylate, (meth)acrylic acid, and, if desired, other addition polymerizable vinyl monomers and copolymers comprising allyl (meth)acrylate, (meth)acrylic acid, and, if desired, other addition polymerizable vinyl monomers. Additionally polyvinylpyrrolidone, polyethylene oxide, etc. are useful as a water-soluble organic linear polymer. Alcohol-soluble polyamide, polyether of 2,2-bis (4-hydroxyphenyl)propane and epichlorohydrin, etc. are also useful to enhance the cured film thickness.

The amount of the linear organic polymer in the photopolymerizable composition is arbitrary but is preferably 30 to 85% by weight. Amounts exceeding 90% result in unfavorable results for image strength. A weight ratio of a polymerizable compound having an unsaturated double bond hereinafter described to the linear organic polymer preferably ranges 1/9 to 9/1, particularly 3/7 to 7/3.

The total amount of polymers in the photopolymerizable composition, inclusive of the polymer having the unit (I), is usually 1 to 99.99%, preferably 5 to 90.0%, still preferably 10 to 70%, by weight based on the total composition. The proportion of the polymer having the unit (I) in all the polymer components is 5 to 100%, preferably 10 to 100%, still preferably 30 to 100%, by weight. Proportions less than 5% can result in a failure to produce the intended effects of the present invention.

The photopolymerizable composition of the invention further contains a polymerizable compound (monomer) having an unsaturated double bond. The polymerizable compound having an unsaturated double bond includes known ones, such as asters of unsaturated carboxylic acids (e.g., acrylic acid, methacrylic acid, itaconic acid, crotonic acid, isocrotonic acid, and maleic acid) with aliphatic polyhydric alcohols and amides of such unsaturated carboxylic acids with aliphatic polyamines.

The unsaturated carboxylic acid/aliphatic polyhydric alcohol ester monomers include acrylic esters, methacrylic esters, itaconic esters, crotonic esters, isocrotonic esters, maleic esters, and mixtures thereof.

Examples of the acrylic esters are ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate, and polyester acrylate oligomers.

Examples of the methacrylic esters are tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, and bis[p-(acryloxyethoxy)phenyl]dimethylmethane. Examples of itaconic esters are ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic esters are ethylene glycol dicrotonate, tetramethylene glycol dicrotonate, pentaerythritol dicrotonate, and sorbitol tetradicrotonate Examples of the isocrotonic esters are ethylene glycol diisocrotonate, pentaerythritol diisocrotonate, and sorbitol tetraisocrotonate. Examples of the maleic esters are ethylene glycol dimaleate, triethylene glycol dimaleate, pentaerythritol dimaleate, and sorbitol tetramaleate.

Examples of the aliphatic polyamine/unsaturated carboxylic acid amide monomers are methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

The polymerizable compound having an unsaturated double bond also include vinylurethane compounds having two or more polymerizable vinyl groups per molecule which are obtained by adding a hydroxyl-containing vinyl compound represented by formula (A) shown below to a polyisocyanate compound having two or more isocyanate groups per molecule, as disclosed in JP-B-48-41708.

$$CH_2=C(R)COOCH_2CH(R')OH \quad (A)$$

wherein R and R' each represent a hydrogen atom or a methyl group.

Also included are urethane acrylates described in JP-A-51-37193, polyester acrylates described in JP-A-48-64183, JP-B-49-43191, and JP-B-52-30490, and polyfunctional (meth)acrylates obtained by the reaction between an epoxy resin and (meth)acrylic acid. Compounds presented as photo-curable monomers or oligomers in *Journal of the Adhesion Society of Japan*, 20(7), 1984, 300–308 are also useful. These polymerizable compounds can be used in the invention in the form of a prepolymer, i.e., a dimer, a trimer, an oligomer or a mixed form thereof.

The polymerizable compound having an unsaturated double bond is usually used in an amount of 1 to 99.99%, preferably 5 to 90.0%, still preferably 10 to 90%, by weight based on the total composition.

The photopolymerizable composition of the invention preferably contains a photopolymerization initiator to increase the sensitivity. Suitable photopolymerization initiators include (a) aromatic ketones, (b) aromatic onium compounds, (c) organic peroxides, (d) thio compounds, (e) hexaarylbiimidazole compounds, (f) ketoxime ester compounds, (g) borate compounds, (h) azinium compounds, (i) metallocene compounds, (j) active ester compounds, and (k) compounds having a carbon-halogen bond.

Preferred aromatic ketones (a) include those having a benzophenone or thioxanthone skeleton described in J. P. Fouassier and J. F. Rabek, *Radiation Curing in Polymer Science and Technology*, 1933, 77–117. Still preferred aromatic ketones (a) are α-thiobenzophenone compounds of JP-B-47-6416, benzoin ether compounds of JP-B-47-3981, α-substituted benzoin compounds of JP-B-47-22326, benzoin derivatives of JP-B-47-23664, aroylphosphonic esters of JP-A-57-30704, dialkoxybenzophenones of JP-B-60-26483, benzoin ethers of JP-B-60-26403 and JP-A-62-81345, α-aminobenzophenones of JP-B-1-34242, U.S. Pat. No. 4,318,791, and EP 0284561A1, p-di(dimethylaminobenzoyl)benzene of JP-A-2-211452, thio-substituted aromatic ketones JP-A-61-194062, acylphosphine sulfides of JP-B-2-9597, acylphosphines of JP-B-2-9596, thioxanthones of JP-B-63-61950, and coumarins of JP-B-59-42864.

The aromatic onium compounds (b) include aromatic onium salts of the groups V, VI and VII elements of the Periodic Table, e.g., N, P, As, Sb, Bi, O, S, Se, Te, and I. Examples of such aromatic onium compounds are given in JP-B-52-14277, JP-B-52-14278, and JP-B-52-14279.

The organic peroxides (c) include almost all organic compounds having at least one oxygen-oxygen bond in the molecule. Examples are methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy) butane, t-butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-xanoyl peroxide, succinperoxide, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, tertiary carbonates, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl) benzophenone, 3,3',4,4'-tetra(cumylperoxycarbonyl) benzophenone, 3,3',4,4'-tetra(p-isopropylcumylperoxycarbonyl)benzophenone, carbonyldi(t-butylperoxy dihydrogen diphthalate), and carbonyldi(t-hexylperoxy dihydrogen diphthalate). Preferred of these peroxide initiators are ester peroxides.

The thio compounds (d) used in the invention as a photopolymerization initiator are represented by formula (II) or (II'):

wherein $R^{20}$ represents an alkyl group, an aryl group or a substituted aryl group; $R^{21}$ represents a hydrogen atom or an alkyl group; or $R^{20}$ and $R^{21}$ each represent a non-metal atomic group and are connected to each other to form a 5- to 7-membered nitrogen-containing ring which may further contain a hetero atom selected from oxygen, sulfur, and nitrogen.

In formulae (II) and (II'), the alkyl group is preferably one containing 1 to 4 carbon atoms, and the aryl group is preferably one containing 6 to 10 carbon atoms, such as phenyl or naphthyl. The substituent of the substituted aryl group includes a halogen atom (e.g., chlorine), an alkyl group (e.g., methyl), and an alkoxy group (e.g., methoxy or ethoxy). $R^{21}$ is preferably an alkyl group having 1 to 4 carbon atoms.

The hexaarylbiimidazole compounds (e) include lophine dimers described in JP-B-45-37377 and JP-B-44-86516.

The ketoxime esters (f) include 3-benzoyloxyiminobutan-2-one, 3-acetoxyiminobutan-2-one, 3-propionyloxyiminobutan-2-one, 2-acetoxyiminopentan-3-one, 2-acetoxy-imino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

The borate compounds (g) include compounds represented by formula (III):

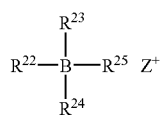

(III)

wherein $R^{22}$, $R^{23}$, $R^{24}$, and $R^{25}$, which may be the same or different, each represent a substituted or unsubstituted alkyl group, a substituted or unsubstituted aryl group, a substituted or unsubstituted alkenyl group, a substituted or unsubstituted alkynyl group or a substituted or unsubstituted heterocyclic group, or two or more of $R^{22}$, $R^{23}$, $R^{24}$, and $R^{25}$ may be connected together to form a cyclic structure, provided that at least one of $R^{22}$, $R^{23}$, $R^{24}$, and $R^{25}$ is a substituted or unsubstituted alkyl group; and $Z^+$ represents an alkali metal cation or a quaternary ammonium cation.

The alkyl group in formula (III) may be straight, branched or cyclic and preferably contains 1 to 18 carbon atoms. Examples of the alkyl group are methyl, ethyl, propyl, isopropyl, butyl, pentyl, hexyl, octyl, stearyl, cyclobutyl, cyclopentyl, and cyclohexyl. The substituent of the substituted alkyl group includes a halogen atom (e.g., chlorine or bromine), a cyano group, a nitro group, an aryl group (preferably phenyl), a hydroxyl group, an amino group of formula: —N($R^{26}$)($R^{27}$) wherein $R^{26}$ and $R^{27}$ each represent a hydrogen atom, an alkyl group having 1 to 14 carbon atoms or an aryl group, a group of formula: —COO$R^{28}$ wherein $R^{28}$ represents a hydrogen atom, an alkyl group having 1 to 14 carbon atoms or an aryl group, a group of formula: —OCO$R^{29}$ wherein $R^{29}$ represents an alkyl group having 1 to 14 carbon atoms or an aryl group, and a group of formula: —O$R^{30}$ wherein $R^{30}$ represents an alkyl group having 1 to 14 carbon atoms or an aryl group.

The aryl group in formula (III) includes mono-, di- or tricyclic aryl groups, such as phenyl and naphthyl. The substituent of the substituted aryl group include those of the above-described substituted alkyl group and an alkyl group having 1 to 14 carbon atoms.

The alkenyl group in formula (III) includes straight-chain, branched or cyclic ones having 2 to 18 carbon atoms. The substituents of the substituted alkenyl group include those enumerated for the substituted alkyl group. The alkynyl group includes straight-chain or branched ones having 2 to 28 carbon atoms. The substituent of the substituted alkynyl group includes those enumerated for the substituted alkyl group. The heterocyclic group in formula (III) includes 5 or more-membered, preferably 5- to 7-membered heterocyclic groups containing at least one of N, S, and O. The heterocyclic group may contain a condensed ring. The substituent of the substituted heterocyclic group includes those of the above-described substituted aryl group.

Examples of the compounds represented by formula (III) are provided in U.S. Pat. Nos. 3,567,453 and 4,343,891 and European Patents 109,772 and 109,773.

The azinium compounds (h) include the compounds having an N—O bond described in JP-A-63-138345, JP-A-63-142345, JP-A-63-142346, JP-A-63-143537, and JP-B-46-42363.

The metallocene compounds (i) include titanocene compounds described in JP-A-59-152396, JP-A-61-151197, JP-A-63-41484, JP-A-2-249, and JP-A-2-4705 and iron-arene complexes described in JP-A-1-304453 and JP-A-1-152109.

Examples of the titanocene compounds are
bis(cyclopentadienyl)titanium dichloride,
bis(cyclopentadienyl)diphenyltitanium,
bis(cyclopentadienyl)bis(2,3,4,5,6-pentafluorophen-1-yl)titanium,
bis(cyclopentadienyl)bis(2,3,5,6-tetrafluorophen-1-yl)titanium, bis(cyclopentadienyl)
bis(2,4,6-trifluoropheny-1-yl)titanium,
bis(cyclopentadienyl)bis(2,6-difluorophen-1-yl)titanium,
bis(cyclopentadienyl)bis(2,4-difluorophen-1-yl)titanium,
bis(methylcyclopentadienyl)bis(2,3,4,5,6-pentafluorophen-1-yl)titanium,
bis(methylcycxlopentadienyl)bis(2,3,5,6-tetrafluorophen-1-yl)titanium,
bis(methylcyclopentadienyl)bis(2,4-difluoropheny-1-yl)titanium,
bis(cyclopentadienyl)bis[2,6-difluoro-3-(pyr-1-yl)phenyl]titanium,
bis(cyclopentadienyl)bis[2,6-difluoro-3-(methylsulfonamido)phenyl]titanium,
bis(cyclopentadienyl)bis[2,6-difluoro-3-(N-butylbiaroylamino)phenyl]titanium,
bis(cyclopentadienyl)bis[2,6-difluoro-3-(N-ethylacetylamino)phenyl]titanium,
bis(cyclopentadienyl)bis[2,6-difluoro-3-(N-methylacetylamino)phenyl]titanium,
bis(cyclopentadienyl)bis[2,6-difluoro-3-(N-ethylpropionylamino)phenyl]titanium,
bis(cyclopentadienyl)bis[2,6-difluoro-3-(N-ethyl-(2,2-dimethylbutanoyl)amino)phenyl]titanium,
bis(cyclopentadienyl)bis[2,6-difluoro-3-(N-butyl-(2,2-dimethylbutanoyl)amino)phenyl]titanium,
bis(cyclopentadienyl)bis[2,6-difluoro-3-(N-pentyl-(2,2-dimethylbutanoyl)amino)phenyl]titanium,
bis(cyclopentadienyl)bis[2,6-difluoro-3-(N-hexyl)-(2,2-dimethylbutanoyl)phenyl]titanium,
bis(cyclopentadienyl)bis[2,6-difluoro-3-(N-methylbutyrylamino)phenyl]titanium,
bis(cyclopentadienyl)bis[2,6-difluoro-3-(N-methylpentanoylamino)phenyl]titanium,
bis(cyclopentadienyl)bis[2,6-difluoro-3-(N-ethylcyclohexylcarbonylamino)phenyl]titanium,
bis(cyclopentadienyl)bis[2,6-difluoro-3-(N-ethylisobutyrylamino)phenyl]titanium,
bis(cyclopentadienyl)bis[2,6-difluoro-3-(2,2,5,5-tetramethyl-1,2,5-azadisilolidin-1-yl)phenyl]titanium,
bis(cyclopentadienyl)bis[2,6-difluoro-3-(octylsulfonamido)phenyl]titanium
bis(cyclopentadienyl)bis[2,6-difluoro-3-(4-tolylsulfonamido)phenyl]titanium,
bis(cyclopentadienyl)bis[2,6-difluoro-3-(4-dodecylphenylsulfonylamido)phenyl]titanium,
bis(cyclopentadienyl)bis[2,6-difluoro-3-(4-(1-pentylheptyl)phenylsulfonylamido)phenyl]titanium,
bis(cyclopentadienyl)bis[2,6-difluoro-3-(ethylsulfonylamido)phenyl]titanium,
bis(cyclopentadienyl)bis[2,6-difluoro-3-((4-bromophenyl)sulfonylamido)phenyl]titanium,
bis(cyclopentadienyl)bis[2,6-difluoro-3-(2-naphthylsulfonylamido)phenyl]titanium,
bis(cyclopentadienyl)bis[2,6-difluoro-3-(hexadecylsulfonylamido)phenyl]titanium, bis(cyclopentadienyl)bis[2,6-difluoro-3-(N-methyl-(4-dodecylphenyl)sulfonylamido)phenyl]titanium,
bis(cyclopentadienyl)bis[2,6-difluoro-3-(N-methyl-4-(1-pentylheptyl)phenyl)sulfonylamido)]titanium,
bis(cyclopentadienyl)bis[2,6-difluoro-3-(N-hexyl-(4-tolyl)sulfonylamido)phenyl]titanium,
bis(cyclopentadienyl)bis[2,6-difluoro-3-(pyrrolidine-2,5-dion-1-yl)phenyl]titanium,
bis(cyclopentadienyl)bis[2,6-difluoro-3-(3,4-dimethyl-3-pyrrolidine-2,5-dion-1-yl)phenyl]titanium,
bis(cyclopentadienyl)bis[2,6-difluoro-3-(phthalimido)phenyl]titanium,
bis(cyclopentadienyl)bis[2,6-difluoro-3-isobutoxycarbonylamino)phenyl]titanium,
bis(cyclopentadienyl)bis[2,6-difluoro-3-(ethoxycarhonylamino)phenyl]titanium,
bis(cyclopentadienyl)bis[2,6-difluoro-3-((2-chloroethoxy)carbonylamino)phenyl]titanium,
bis(cyclopentadienyl)bis[2,6-difluoro-3-(phenoxycarbonylamino)phenyl]titanium,
bis(cyclopentadienyl)bis[2,6-difluoro-3-(3-phenylthioureido)phenyl]titanium,
bis(cyclopentadienyl)bis[2,6-difluoro-3-(3-butylthioureido)phenyl]titanium,
bis(cyclopentadienyl)bis[2,6-difluoro-3-(3-phenylureido)phenyl]titanium,
bis(cyclopentadienyl)bis[2,6-difluoro-3-(3-butylureido)phenyl]titanium,
bis(cyclopentadienyl)bis[2,6-difluoro-3-(N,N-diacetylamino)phenyl]titanium,
bis(cyclopentadienyl)bis[2,6-difluoro-3-(3,3-dimethylureido)phenyl]titanium,
bis(cyclopentadienyl)bis[2,6-difluoro-3-(acetylamino)phenyl]titanium,
bis(cyclopentadienyl)bis[2,6-difluoro-3-(butyrylamino)phenyl]titanium,
bis(cyclopentadienyl)bis[2,6-difluoro-3-(decanoylamino)phenyl]titanium,
bis(cyclopentadienyl)bis[2,6-difluoro-3-(octadecanoylamino)phenyl]titanium,
bis(cyclopentadienyl)bis[2,6-difluoro-3-(isobutyrylamino)phenyl]titanium,
bis(cyclopentadienyl)bis[2,6-difluoro-3-(2-ethylhexanoylamino)phenyl]titanium,
bis(cyclopentadienyl)bis[2,6-difluoro-3-(2-methylbutanoylamino)phenyl]titanium,
bis(cyclopentadienyl)bis[2,6-difluoro-3-(pivaloylamino)phenyl]titanium,
bis(cyclopentadienyl)bis[2,6-difluoro-3-(2,2-dimethylbutanoylamino)phenyl]titanium,
bis(cyclopentadienyl)bis[2,6-difluoro-3-(2-ethyl-2-methylheptanoylamino)phenyl]titanium,
bis(cyclopentadienyl)bis[2,6-difluoro-3-(cyclohexylcarbonylamino)phenyl]titanium,
bis(cyclopentadienyl)bis [2,6-difluoro-3-(2,2-dimethyl-3-chloropropanoylamino)phenyl]titanium,
bis(cyclopentadienyl)bis[2,6-difluoro-3-(3-phenylpropanoylamino)phenyl]titanium,
bis(cyclopentadienyl)bis[2,6-difluoro-3-(2-chloromethyl-2-methyl-3-chloropropanoylamino)phenyl]titanium,
bis(cyclopentadienyl)bis[2,6-difluoro-3-(3,4-xyloylamino)phenyl]titanium,
bis(cyclopentadienyl)bis[2,6-difluoro-3-(4-ethylbenzoylamino)phenyl]titanium,
bis(cyclopentadienyl)bis[2,6-difluoro-3-(2,4,6-mesitylcarbonylamino)phenyl]titanium,
bis(cyclopentadienyl)bis[2,6-difluoro-3-(benzoylamino)phenyl]titanium,
bis(cyclopentadienyl)bis[2,6-difluoro-3-(N-(3-phenylpropyl)benzoylamino)phenyl]titanium,
bis(cyclopentadienyl)bis[2,6-difluoro-3-(N-(3-ethylheptyl)-2,2-dimethylpentanoylamino)phenyl]titanium,
bis(cyclopentadienyl)bis[2,6-difluoro-3-(N-isobutyl-(4-toluyl)amino)phenyl]titanium,
bis(cyclopentadienyl)bis[2,6-difluoro-3-(N-isobutylbenzoylamino)phenyl]titanium,
bis(cyclopentadienyl)bis[2,6-difluoro-3-(N-cyclohexylmethylpivaloylamino)phenyl]titanium,
bis(cyclopentadienyl)bis[2,6-difluoro-3-(N-(oxolan-2-ylmethyl)benzoylamino)phenyl]titanium,
bis(cyclopentadienyl)bis[2,6-difluoro-3-(N-(3-ethylheptyl)-2,2-dimethylbutanoylamino)phenyl]titanium,
bis(cyclopentadienyl)bis[2,6-difluoro-3-(N-(3-phenylpropyl-(4-toluyl)amino)phenyl]titanium,
bis(cyclopentadienyl)bis[2,6-difluoro-3-(N-(oxolan-2-ylmethyl)-(4-toluyl)amino)phenyl)titanium,
bis(cyclopentadienyl)bis[2,6-difluoro-3-(N-(4-toluylmethyl)benzoylamino)phenyl]titanium,
bis(cyclopentadienyl)bis[2,6-difluoro-3-(N-(4-toluylmethyl)-(4-toluyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-butyl-(4-toluyl)amino)phenyl]titanium,
bis(cyclopentadienyl)bis[2,6-difluoro-3-(N-hexyl-(4-toluyl)amino)phenyl]titanium,
bis(cyclopentadienyl)bis[2,6-difluoro-3-(N-(2,4-dimethylpentyl)-2,2-dimethylbutanoylamino)phenyl]titanium,
bis(cyclopentadienyl)bis[2,6-difluoro-3-(2,4-dimethylpentyl)-2,2-dimethylpentanoylamino)phenyl]titanium,
bis(cyclopentadienyl)bis[2,6-difluoro-3-((4-toluyl)amino)phenyl]titanium,
bis(cyclopentadienyl)bis[2,6-difluoro-3-(2,2-dimethylpentanoylamino)phenyl]titanium,
bis(cyclopentadienyl)bis[2,6-difluoro-3-(2,2-dimethyl-3-ethoxypropanoylamino)phenyl]titanium,
bis(cyclopentadienyl)bis[2,6-difluoro-3-(2,2-dimethyl-3-allyloxypropanoylamino)phenyl]titanium,
bis(cyclopentadienyl)bis[2,6-difluoro-3-(N-allylacetylamino)phenyl]titanium,
bis(cyclopentadienyl)bis[2,6-difluoro-3-(2-ethylbutanoylamino)phenyl]titanium,
bis(cyclopentadienyl)bis(2,6-difluoro-3-(N-cyclohexylmethylbenzoylamino)phenyl]titanium,
bis(cyclopentadienyl)bis[2,6-difluoro-3-(N-cyclohexylmethyl-(4-toluyl)amino)phenyl]titanium,
bis(cyclopentadienyl)bis[2,6-difluoro-3-(N-(2-ethylhexyl)benzoylamino)phenyl]titanium,
bis(cyclopentadienyl)bis[2,6-difluoro-3-(N-isopropylbenzoylamino)phenyl]titanium,
bis(cyclopentadienyl)bis[2,6-difluoro-3-(N-phenylpropyl)-2,2-dimethylpentanoyl)amino)phenyl]titanium,
bis(cyclopentadienyl)bis[2,6-difluoro-3-(N-hexylbenzoylamino)phenyl]titanium,
bis(cyclopentadienyl)bis[2,6-difluoro-3-(N-cyclohexylmethyl-2,2-dimethylpentanoyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-(2-ethylhexyl)-2,2-dimethylpentanoyl)amino)phenyl]titanium,
bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium,
bis(cyclopentadienyl)bis[2,6-difluoro-3-(N-3-phenylpropyl)pivaloylamino)phenyl]titanium,
bis(cyclopentadienyl)bis[2,6-difluoro-3-(N-butyl-2,2-dimethylpentanoylamino)phenyl]titanium,
bis(cyclopentadienyl)bis[2,6-difluoro-3-(N-(2-methoxyethyl)benzoylamino)phenyl]titanium,
bis(cyclopentadienyl)bis[2,6-difluoro-3-(N-benzylbenzoylamino)phenyl]titanium,
bis(cyclopentadienyl)bis[2,6-difluoro-3-(N-benzyl-(4-toluyl)amino)phenyl]titanium,
bis(cyclopentadienyl)bis[2,6-difluoro-3-(N-(2-methoxyethyl)-(4-toluyl)amino)phenyl]titanium,
bis(cyclopentadienyl)bis[2,6-difluoro-3-(4-methylphenylmethyl)-2,2-dimethylpentanoylamino)phenyl]titanium,
bis(cyclopentadienyl)bis[2,6-difluoro-3-(N-(2-methoxyethyl)-2,2-dimethylpentanoylamino)phenyl]titanium,
bis(cyclopentadienyl)bis[2,6-difluoro-3-(N-cyclohexylmethyl-(2-ethyl-2-methylheptanoyl)amino)phenyl]titanium,
bis(cyclopentadienyl)bis[2,6-difluoro-3-(N-butyl-(4-chlorobenzoyl)amino)phenyl]titanium,
bis(cyclopentadienyl)bis[2,6-difluoro-3-(N-hexyl-(2-ethyl-2-methylbutanoyl)amino)phenyl]titanium,
bis(cyclopentadienyl)bis[2,6-difluoro-3-(N-cyclohexyl-2,2-dimethylpentanoylamino)phenyl]titanium,
bis(cyclopentadienyl)bis[2,6-difluoro-3-(N-(oxolan-2-ylmethyl)-2,2-dimethylpentanoyl)amino)phenyl]titanium,
bis(cyclopentadienyl)bis[2,6-difluoro-3-(N-cyclohexyl-(4-chlorobenzoyl)amino)phenyl]titanium,
bis(cyclopentadienyl)bis[2,6-difluoro-3-(N-cyclohexyl-(2-chlorobenzoyl)amino)phenyl]titanium,
bis(cyclopentadienyl)bis[2,6-difluoro-3-(3,3-dimethyl-2-azetidinon-1-yl)phenyl]titanium,
bis(cyclopentadienyl)bis(2,6-difluoro-3-isocyanatophenyl)titanium,
bis(cyclopentadienyl)bis[2,6-difluoro-3-(N-ethyl-(4-tolylsulfonyl)amino)phenyl]titanium,
bis(cyclopentadienyl)bis[2,6-difluoro-3-(N-hexyl-(4-tolylsulfonyl)amino)phenyl]titanium,
bis(cyclopentadienyl)bis[2,6-difluoro-3-(N-butyl-(4-tolylsulfonyl)amino)phenyl]titanium,
bis(cyclopentadienyl)bis[2,6-difluoro-3-(N-isobutyl-(4-tolylsulfonyl)amino)phenyl]titanium,
bis(cyclopentadienyl)bis[2,6-difluoro-3-(N-butyl-(2,2-dimethyl-3-chloropropanoyl)amino)phenyl]titanium,
bis(cyclopentadienyl)bis[2,6-difluoro-3-(N-(3-phenylpropanoyl)-2,2-dimethyl-3-chloropropanoyl)amino)phenyl]titanium,
bis(cyclopentadienyl)bis[2,6-difluoro-3-(N-cyclohexylmethyl-(2,2-dimethyl-3-chloropropanoyl)amino)phenyl]titanium,
bis(cyclopentadienyl)bis[2,6-difluoro-3-(N-isobutyl-(2,2-dimethyl-3-chloropropanol)phenyl]titanium,
bis(cyclopentadienyl)bis[2,6-difluoro-3-(N-butyl-(2-chloromethyl-2-methyl-3-chloropropanoyl)amino)phenyl]titanium,
bis(cyclopentadienyl)bis[2,6-difluoro-3-(butylthiocarbonylamino)phenyl]titanium,
bis(cyclopentadienyl)bis[2,6-difluoro-3-(phenylthiocarbonylamino)phenyl]titanium,
bis(methylcyclopentadienyl)bis[2,6-difluoro-3-(N-hexyl-2,2-dimethylbutanoyl)amino)phenyl]titanium,
bis(methylcyclopentadienyl)bis[2,6-difluoro-3-(N-hexyl-2,2-dimethylpentanoylamino)phenyl]titanium,
bis(methylcyclopentadienyl)bis[2,6-difluoro-3-(N-ethylacetytlamino)phenyl]titanium,
bis(methylcyclopentadienyl)bis[2,6-difluoro-3-(N-ethylpropionylamino)phenyl]titanium,
bis(trimethylsilylcyclopentadienyl)bis[2,6-difluoro-3-(N-butyl-2,2-dimethylpropanoylamino)phenyl]titanium,
bis(cyclopentadienyl)bis[2,6-difluoro-3-(N-(2-methoxyethyl)-trimethylsilylamino)phenyl]titanium,
bis(cyclopentadienyl)bis[2,6-difluoro-3-(N-butylhexyldimethylsilylamino)phenyl]titanium,
bis(cyclopentadienyl)bis[2,6-difluoro-3-(N-ethyl-(1,1,2-trimethylpropyl)dimethylsilylamino)phenyl]titanium,
bis(cyclopentadienyl)bis[2,6-difluoro-3-(3-ethoxymethyl-3-methyl-2-azethiodinon-1-yl)phenyl]titanium,
bis(cyclopentadienyl)bis[2,6-difluoro-3-(3-allyloxymethyl-3-methyl-2-azetidinon-1-yl)phenyl]titanium,
bis(cyclopentadienyl)bis[2,6-difluoro-3-(3-chloromethyl-3-methyl-2-azetidinon-1-yl)phenyl]titanium,
bis(cyclopentadienyl)bis[2,6-difluoro-3-(N-benzyl-2,2-dimethylpropanoylamino)phenyl]titanium,
bis(cyclopentadienyl)bis[2,6-difluoro-3-(5,5-dimethyl-2-pyrrodininon-1-yl)phenyl]titanium,
bis(cyclopentadienyl)bis[2,6-difluoro-3-(6,6-diphenyl-2-piperidinon-1-yl)phenyl]titanium,
bis(cyclopentadienyl)bis[2,6-difluoro-3-(N-(2,3-dihydro-1,2-benzoisothiazol-3-one(1,1-dioxide)-2-yl)phenyl]titanium,
bis(cyclopentadienyl)bis[2,6-difluoro-3-(N-hexyl-(4-chlorobenzoyl)amino)phenyl]titanium,
bis(cyclopentadienyl)bis[2,6-difluoro-3-(N-hexyl-(2-chlorobenzoyl)amino)phenyl]titanium,
bis(cyclopentadienyl)bis[2,6-difluoro-3-(N-isopropyl-(4-chlorobenzoyl)amino)phenyl]titanium,
bis(cyclopentadienyl)bis[2,6-difluoro-3-(N-(4-methylphenylmethyl)-(4-chlorobenzoyl)amino)phenyl]titanium,
bis(cyclopentadienyl)bis[2,6-difluoro-3-(N-(4-methylphenylmethyl)-(2-chlorobenzoyl)amino)phenyl]titanium,
bis(cyclopentadienyl)bis[2,6-difluoro-3-(N-benzyl-2,2-dimethylpentanoylamino)phenyl]titanium,
bis(cyclopentadienyl)bis[2,6-difluoro-3-(N-(2-ethylhexyl)-4-tolyl-sulfonyl)amino)phenyl]titanium,
bis(cyclopentadienyl)bis[2,6-difluoro-3-(N-(3-oxaheptyl)benzoylamino)phenyl]titanium,
bis(cyclopentadienyl)bis[2,6-difluoro-3-(N-(3,6-dioxadecyl)benzoylamino)phenyl]titanium,
bis(cyclopentadienyl)bis[2,6-difluoro-3-(trifluoromethylsulfonyl)amino)phenyl]titanium,
bis(cyclopentadienyl)bis[2,6-difluoro-3-(trifluoroacetylamino)phenyl]titanium,
bis(cyclopentadienyl)bis[2,6-difluoro-3-(2-chlorobenzoyl)amino)phenyl]titanium,
bis(cyclopentadienyl)bis[2,6-difluoro-3-(4-chlorobenzoyl)amino)phenyl]titanium,
bis(cyclopentadienyl)bis[2,6-difluoro-3-(N-(3,6-dioxadecyl)-2,2-dimethylpentanoylamino)phenyl]titanium,
bis(cyclopentadienyl)bis[2,6-difluoro-3-(N-(3,7-dimethyl-7-methoxyoctyl)benzoylamino)phenyl]titanium, and
bis(cyclopentadienyl)bis[2,6difluoro-3-(N-cyclohexylbenzoylamino)phenyl]titanium.

The active ester compounds (j) include imidosulfonate compounds described in JP-B-62-6223 and active sulfonates described in JP-B-63-14340 and JP-A-59-174831.

The compounds (k) having a carbon-halogen bond preferably include compounds represented by formulae (IV) through (X) shown below.

Trihalomethyl-s-triazine compounds represented by formula (IV):

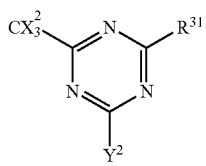

(IV)

wherein $X^2$ represents a halogen atom; $Y^2$ represents $-C(X^2)_3$, $-NH_2$, $-NHR^{32}$, $-NR^{32}$ or $-OR^{32}$; $R^{32}$ represents an alkyl group, a substituted alkyl group, an aryl group or a substituted aryl group; and $R^{31}$ represents $-C(X^2)_3$, an alkyl group, a substituted alkyl group, an aryl group, a substituted aryl group or a substituted alkenyl group.

Compounds represented by formula (V):

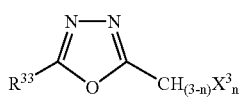

(V)

wherein $R^{33}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of 1 to 3.

Compounds represented by formula (VI):

$$R^{34}-Z^2-CH_{(2-m)}X^3{}_mR^{35}$$ (VI)

wherein $R^{34}$ represents an aryl group or a substituted aryl group; $R^{35}$ represents $-C(=O)-NR^{36}R^{37}$, $-C(=S)-NR^{36}R^{37}$,

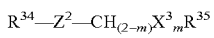

or halogen; $Z^2$ represents $-C(=O)-$, $-C(=S)-$ or $-SO_2-$; $R^{36}$ and $R^{37}$ each represent an alkyl group, a substituted alkyl group, an alkenyl group, a substituted alkenyl group, an aryl group or a substituted aryl group; $R^{38}$ has the same meaning as $R^{32}$ of formula (IV); $X^3$ represents a halogen atom; and m represents 1 or 2.

Compounds represented by formula (VII):

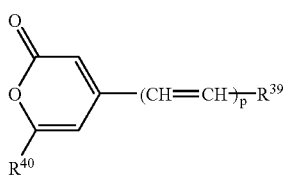

(VII)

wherein $R^{39}$ represents a substituted or unsubstituted aryl group or a substituted or unsubstituted heterocyclic group; $R^{40}$ represents a trihaloalkyl group having 1 to 3 carbon atoms or a trihaloalkenyl group having 1 to 3 carbon atoms; and p represents 1, 2 or 3.

Carbonylmethylene heterocyclic compounds having a trihalogenomethyl group, being represented by formula (VIII):

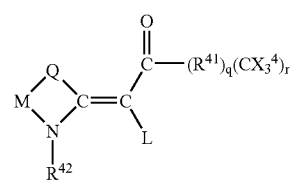

(VIII)

wherein L represents a hydrogen atom or $-C(=O)-(R^{41})_qC(X^4)_3)_r$; Q represents a sulfur atom, a selenium atom, an oxygen atom, a dialkylmethylene group, an alken-1,2-ylene group, a 1,2-phenylene group or $=N-R$; M represents a substituted or unsubstituted alkylene group, a substituted or unsubstituted alkenylene group or a 1,2-arylene group; $R^{42}$ represents an alkyl group, an aralkyl group or an alkoxyalkyl group; $R^{41}$ represents a divalent aromatic hydrocarbon or heterocyclic group; $X^4$ represents a chlorine atom, a bromine atom or an iodine atom; q represents 0 or 1; and r represents 1 when q=0 or r represents 1 or 2 when q=1.

4-Halogeno-5-(halogenomethylphenyl)oxazole derivatives represented by formula (IX):

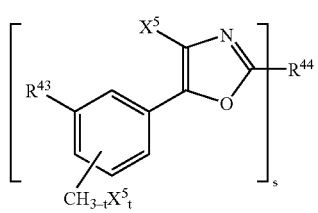

(IX)

wherein $X^5$ represents a halogen atom; t represents an integer of 1 to 3; s represents an integer of 1 to 4; $R^{43}$ represents a hydrogen atom or $-CH_{3-t}X^5{}_t$; and $R^{44}$ represents a substituted or unsubstituted, s-valent unsaturated organic group.

2-(Halogenomethylphenyl)-4-halogeno-oxazole derivatives represented by formula (X):

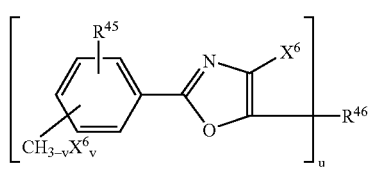

(X)

wherein $X^6$ represents a halogen atom; v represents an integer of 1 to 3; u represents an integer of 1 to 4; $R^{45}$ represents a hydrogen atom or $-CH_{3-v}X^6{}_v$; $R^{46}$ represents a substituted or unsubstituted u-valent unsaturated organic group.

The compounds represented by formulae (IV) to (X) include those described in Wakabayashi et al., *Bull. Chem. Soc. Japan*, 42, 1969, 2924, British Patent 1388492, JP-A-

53-133428, and German Patent 3337024, F. C. Schaefer et al., *J. Org. Chem.*, 29, 1964, 1527, JP-A-62-58241, and JP-A-5-281728; compounds that are easily synthesized by one skilled in the art in accordance with the process taught in M. P. Hutt, E. F. Elslager, and L. M. Herbel, *Journal of Heterocyclic Chemistry*, 7(3), 1970, 511 et seq.; and compounds described in German Patents 2641100, 3333450, 3021590, and 3021599.

Of the above-recited photopolymerization initiators, still preferred are those capable of generating radicals by the action of laser light having wavelengths of 300 to 1200 nm.

Of the photopolymerization initiators (a) to (k), particularly preferred for use in the invention include the aromatic ketones (a), the aromatic onium compounds (b), the organic peroxides (c), the hexaarylbiimidazole compounds (e), the metallocene compounds (i), and the compounds having a carbon-halogen bond (j). The aromatic iodonium salts, the aromatic diazonium salts, the titanocene compounds, and the trihalomethyl-s-triazine compounds of formula (IV) are especially preferred.

The above-described photopolymerization initiators can be used either individually or as a combination of two or more thereof.

The photopolymerizable composition of the invention can further comprise a sensitizer. Useful sensitizers include spectral sensitizing colors (dyes and pigments) and dyes or pigments which interact with the photopolymerization initiator upon absorption of light from a light source.

Suitable spectral sensitizers include polycyclic aromatic compounds (e.g., pyrene, perylene, and triphenylene), xanthenes (e.g., Fluorescein, Eosine, Erythrocin, Rhodamine B, and Rose Bengale), cyanines (e.g., thiacarbocyanine and oxacarbocyanine), merocyanines (e.g., merocyanine and carbomerocyanine), thiazines (e.g. Thionine Blue, Methylene Blue, and Toluidine Blue), acridines (e.g., Acridine Orange, chloroflavin, and acriflavine), phthalocyanines (e.g., metal-free phthalocyanine and metallo-phthalocyanines), porphyrins (e.g., tetraphenylprophyrin and metalloporphyrins), chlorophylls (e.g., chlorophyll, chlorophyllin, and chlorophyll with Mg displaced with other metals), metal complexes, anthraquinones (e.g., anthraquinone), squaryliums (e.g., squarylium).

Examples of preferred spectral sensitizers include styryl colors of JP-B-37-13034, cationic dyes of JP-A-62-143044, quinoxalinium salts of JP-A-59-24147, new Methylene Blue compounds of JP-A-64-33104, anthraquinones of JP-A-64-56767, benzoxanthene dyes of JP-A-2-1714, acridines of JP-A-2-226148 and JP-A-2-226149, pyrylium salts of JP-B-40-28499, cyanines of JP-B-46-42363, benzofuran colors of JP-A-2-63053, conjugated ketone colors of JP-A-2-85858 and JP-A-2-216154, colors of JP-A-57-10605, azocinnamilidene derivatives of JP-B-2-30321, cyanine colors of JP-A-1-287105, xanthene colors of JP-A-62-31844, JP-A-62-31848, and JP-A-62-143043, aminostyrylketones of JP-B-59-28325, merocyanine colors of JP-B-61-9621, colors of JP-A-2-179643, merocyanine colors of JP-A-2-244050, merocyanine colors of JP-B-59-28326, merocyanine colors of JP-A-59-89303, merocyanine colors of Japanese Patent 3278307, and benzopyran colors of JP-A-8-334897.

Infrared absorbers (dyes or pigments) are also suitable sensitizers. Preferred infrared absorbing dyes include cyanine dyes disclosed in JP-A-58-125246, JP-A-59-84356, JP-A-59-202829, JP-A-60-78787, and British Patent 434, 875.

Near infrared absorbing sensitizers described in U.S. Pat. No. 5,156,938 are also suitable. Arylbenzo(thio)pyrylium, salts of U.S. Pat. No. 3,881,924, trimethinethiapyrylium salts of U.S. Pat. No. 4,327,169 (corresponding to JP-A-57-142645), pyrylium compounds of JP-A-58-181051, JP-A-58-220143, JP-A-59-41363, JP-A-59-84248, JP-A-59-84249, JP-A-59-146063, and JP-A-59-146061, cyanine colors of JP-A-59-216146, pentamethinethiopyrylium salts, etc. of U.S. Pat. No. 4,283,475, and pyrylium compounds of JP-B-5-13514 and JP-B-5-19702 are also preferred sensitizers.

The near infrared absorbing dyes of U.S. Pat. No. 4,756, 993 (compounds of formulae (I) and (II) in the Patent) and the phthalocyanine dyes of EP916513A2 are also preferred dyes.

Anionic infrared absorbers described in JP-A-2000-16031 are also suitable as a sensitizer. "Anionic infrared absorbers" are compounds of which the chromophoric nucleus substantially absorbing infrared rays has no cationic structure but an anionic structure, including (c1) anionic metal complexes, (c2) anionic carbon black derivatives, (c3) anionic phthalocyanine derivatives, and (c4) compounds represented by formula:

wherein the symbols will be defined later. The counter cations in these anionic infrared absorbers include monovalent cations including a proton and polyvalent cations.

The anionic metal complexes (c1) are such metal complexes in which the whole of the center metal and the ligands, which substantially absorbs infrared rays, has an anionic charge.

The anionic carbon black derivatives (c2) include carbon black species having an anionic substituent, such as a sulfo group, a carboxyl group or a phospho group, bonded thereto. These substituents can be introduced to carbon black by oxidizing carbon black with a prescribed acid as described in Carbon Black Kyokai (ed.), *Carbon Black Binran*, 3rd Ed., Carbon Black Kyokai, (April, 1995), 12.

The anionic phthalocyanine derivatives (c3) are compounds having such an anionic substituent as recited with reference to (c2) bonded to a phthalocyanine skeleton to become an anion as a whole.

In the formula representing the compounds (c4), $G_a^-$ represents an anionic substituent; $G_b$ represents a neutral substituent; $X^{m+}$ represents a 1 to m-valent cation including a proton; m represents an integer of 1 to 6; and M represents a conjugated chain. The conjugated chain M, which may have a substituent or a cyclic structure, is represented by formula:

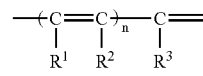

wherein $R^1$, $R^2$, and $R^3$ each represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; they may be connected together to form a cyclic structure; and n represents an integer of 1 to 8.

Cationic infrared absorbers and nonionic infrared absorbers are also preferably used.

Other known dyes, such as those listed in Society of Synthetic Organic Chemistry, Japan (ed.), *Senryo Binran*, 1960. Such dyes include azo dyes, metal complex azo dyes, pyrazolone azo dyes, naphthoquinone dyes, anthraquinone dyes, phthalocyanine dyes, carbonium dyes, quinoneimrine dyes, methine dyes, diimmonium dyes, aminium dyes, squarylium colors, and metal thiolate complexes.

Pigments which can be used as a sensitizer additionally include commercially available pigments and pigments described in *Color Index*, Nihon Ganryo Gijutsu Kyoukai (ed.), *Saishin Ganryo Binran*, 1977, *Saishin Ganryo Ohyo Gijutsu*, CMC Publishing Co., Ltd., 1986, and *Insatsu Ink Gijutsu*, CMC Publishing Co., Ltd., 1984, such as black pigments, yellow pigments, orange pigments, brown pigments, red pigments, purple pigments, blue pigments, green pigments, fluorescent pigments, metal powder pigments, and polymer-linked pigments. Examples include insoluble azo pigments, azo lake pigments, condensed azo pigments, chelate azo dyes, phthalocyanine pigments, anthraquinone pigments, perylene and perinone pigments, thioindigo pigments, quinacridone pigments, dioxazine pigments, isoindolinone pigments, quinophthalone pigments, dye lake pigments, azine pigments, nitroso pigments, nitro pigments, natural pigments, fluorescent pigments, inorganic pigments, and carbon black. Carbon black is preferred among them.

These pigments can be used with or without a surface treatment. Conceivable surface treatments for pigments include applying a resin or a wax, adhering a surface active agent, and bonding a reactive substance (e.g., silane coupling agent, epoxy compound or polyisocyanate) to the pigment particle surface. These surface treatments are described in *Kinzoku Sekken no Seisitsu to Ohyo*, Saiwai Syobo, *Insatsu Ink Gijutsu*, CMC Publishing Co., Ltd., 1984, and *Saishin Ganryo Ohyo Gijutsu*, CMC Publishing Co., Ltd., 1986.

The pigments preferably have a particle size of 0.01 to 10 μm, particularly 0.05 to 1 μm, especially 0.1 to 1 μm. Pigment particles smaller than 0.01 μm tend to be instable in a pigment dispersion having been added to a coating composition for forming an image recording layer. Particles greater than 10 μm are unfavorable for uniformity of an image recording layer.

Pigment particles are dispersed by known dispersing techniques used in ink or toner manufacturing. Useful dispersing machines include an ultrasonicator, a sand mill, an attritor, a pearl mill, a super mill, a ball mill, an impeller, a disperser, a KD mill, a colloid mill, a Dynatron, a three-roll mill, and a pressure kneader. For the details of the dispersing techniques reference can be made in *Saishin Ganryo Ohyo Gijytsu*, CMC Publishing Co., Ltd., 1986.

Particularly preferred sensitizers are the merocyanine colors of JP-B-61-9621, JP-A-2-179643, JP-A-2-244050, JP-B-59-28326, JP-A-59-89303, and Japanese Patent 3278307 and the benzopyran colors of JP-A-8-334897, and the infrared absorbers of JP-A-11-209001.

The sensitizers can be used either individually or as a combination of two or more thereof.

The photopolymerizable composition of the invention can comprise a compound known to be effective to further improve the sensitivity or suppress polymerization inhibition by oxygen as a cosensitizer. Compounds useful as a cosensitizer include amines, such as the compounds described in M. R. Sander et al., *Journal of Polymer Society*, 10, 1972, 3137, JP-B-44-20189, JP-A-51-82102, JP-A-52-134692, JP-A-59-138205, JP-A-60-84305, JP-A-62-18537, JP-A-64-33104, and *Research Disclosure*, 33825. Specific examples are triethanolamine, ethyl p-dimethylaminobenzoate, p-formyldimethylaniline, and p-methylthiodimethylaniline.

Useful cosensitizers also include thiols and sulfides, such as the thiol compounds of JP-A-53-702, JP-B-55-500806, and JP-A-5-142772 and the disulfide compounds of JP-A-56-75643. Specific examples are 2-mercaptobenzothiazole, 2-mercaptobenzoxazole, 2-mercaptobenzimidazole, 2-mercapto-4(3H)-quinazoline, and β-mercaptonaphthalene.

Useful cosensitizers also include amino acid compounds (e.g., N-phenylglycine), the organometallic compounds of JP-B-48-42965 (e.g., tributyltin acetate), the hydrogen-donating compounds of JP-B-55-34414, the sulfur compounds of JP-A-6-308727 (e.g., trithiane), the phosphorus compounds of JP-A-6-250389 (e.g., diethyl phosphite), and Si—H compounds and Ge—H compounds of Japanese Patent Application No. 6-191605.

The photopolymerization initiator is used in an amount preferably of 0.01 to 60% by weight, particularly 0.05 to 30% by weight, based on the total composition. A preferred molar ratio of the photopolymerization initiator to the sensitizer, if used, is 100:0 to 1:99, particularly 90:10 to 10:90, especially 80:20 to 20:80. The amount of the cosensitizer, if used, is suitably 0.01 to 50 parts, preferably 0.02 to 20 parts, still preferably 0.05 to 10 parts, by weight per part by weight of the photopolymerization initiator.

It is desirable to add to the photopolymerizable composition a small amount of a thermal polymerization inhibitor for inhibiting unnecessary thermal polymerization of the polymerizable compound having a polymerizable unsaturated double bond during the preparation or storage of the photopolymerizable composition. Suitable thermal polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and N-nitrosophenylhydroxylamine cerium (III) salt. The amount of the thermal polymerization inhibitor is preferably about 0.01 to 5% by weight based on the total composition. If desired, polymerization inhibition by oxygen can be prevented by adding a higher fatty acid or a derivative thereof, such as behenic acid or behenic acid amide, which is localized on the surface of the photosensitive layer during drying after application. The amount of the higher fatty acid or derivative thereof to be added is about 0.5 to 10% by weight based on the total composition.

The photopolymerizable composition can contain a colorant (dye or pigment) for coloring the photosensitive layer thereby to improve visibility after platemaking or suitability to inspection with, for example, an image density measuring instrument. Pigments are preferred to dyes; for most of dyes can reduce the sensitivity of a photopolymerizable photosensitive layer. Suitable colorants include phthalocyanine pigments, azo pigments, carbon black, titanium oxide, Ethyl Violet, Crystal Violet, azo dyes, anthraquinone dyes, and cyanine dyes. A preferred amount of the colorant to be added is about 0.5 to 5% by weight based on the total composition.

If desired, the photopolymerizable composition may contain other additives known in the art, such as inorganic fillers for improving physical properties of a cured film, plasticizers, and oleophilizing agents for improving ink receptivity of the photosensitive layer.

Useful plasticizers include dioctyl phthalate, didodecyl phthalate, triethylene glycol dicaprylate, dimethyl glycol phthalate, tricresyl phosphate, dioctyl adipate, dibutyl sebacate, and glycerol triacetate. Where the composition contains a binder, the plasticizer is used in an amount of not more than 10% by weight based on the total weight of the polymerizable compound having an unsaturated double bond and the binder.

The composition may also contain a UV initiator, a thermal crosslinking agent, and the like for enhancing the effects of post-heating and post-exposure after development (hereinafter described) which are conducted for improving film strength (press life).

Adhesion of the photosensitive layer to a support and developability (removability) of the unexposed area of the photosensitive layer can be improved by addition of an appropriate additive or by providing an intermediate layer. For example, a compound exhibiting relatively strong mutual action on a support, such as a compound having a diazonium structure or a phosphone compound, may be added to the composition or be provided as a primer coat, which will result in improved adhesion and an extended press life. A hydrophilic polymer, such as polyacrylic acid or polysulfonic acid, may be added to the composition or be provided as a primer coat to bring about improved developability and improved stain resistance of the nonimage area.

The photopolymerizable composition of the invention is dissolved in various organic solvents to prepare a coating composition, which is applied to a support to form a photosensitive layer. Examples of useful organic solvents are acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used either individually or as a mixture thereof. The solids content of the coating composition is preferably 2 to 50% by weight.

The coating weight of the photosensitive layer on a support, which is influential chiefly on the sensitivity and developability of the photosensitive layer and the strength and press life of the cured layer, should be decided appropriately according to use. Too small a coating weight results in poor press life. To large a coating weight results in reduced sensitivity and requires an increased exposure time and an increased developing time. For use in a lithographic printing plate precursor for scanning exposure, the application primarily contemplated in the present invention, a suitable coating weight is in a range of from about 0.1 to 10 g/m$^2$, particularly 0.5 to 5 g/m$^2$, on dry basis.

In fabricating a lithographic printing plate as primarily contemplated in the invention, the photosensitive layer is desirably formed on a support having a water-wettable surface. Any water-wettable support known in the lithographic printing plate field can be used with no restriction. Plate form supports having dimensional stability are preferred. Useful water-wettable supports include paper, paper laminated with plastics (e.g., polyethylene, polypropylene and polystyrene), metal (e.g., aluminum, zinc or copper) plates, films of plastics (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or plastic films laminated with or vacuum evaporation coated with the metal recited above. If necessary, the surface of the support may be subjected to a known physical or chemical treatment for imparting water wettability, improved strength, and the like.

Paper, a polyester film or an aluminum plate is a preferred support. An aluminum plate is particularly preferred for its dimensional stability, relatively competitive price, and capability of providing a surface excellent in water wettability or strength by an appropriate surface treatment. A composite sheet composed of a polyethylene terephthalate film laminated with an aluminum sheet, such as the one described in JP-B-48-18327, is also preferred.

A suitable aluminum plate is a plate of pure aluminum or an aluminum alloy comprising aluminum as a main element and a small amount of a different element. A plastic film laminated with or vacuum evaporation coated with aluminum will also do. The different element is selected form silicon, iron, manganese, copper, magnesium, chromium, zinc, bismuth, nickel, titanium, and so forth. The different element content of the aluminum alloy is 10% by weight at the highest. The "aluminum" as referred to above is preferably pure aluminum but may contain permissible traces of impurity elements because of technical difficulties encountered in the manufacture of pure aluminum. The aluminum plate used in the invention is not particularly limited in composition, and plates made of known aluminum materials can be utilized. The thickness of the aluminum plate to be used is about 0.1 to 0.6 mm, preferably 0.15 to 0.4 mm, still preferably 0.2 to 0.3 mm.

The metal surface, particularly the aluminum surface, of the support is preferably subjected to a surface treatment, such as surface graining, immersion in an aqueous solution of sodium silicate, potassium fluorozirconate, a phosphate, etc., or anodizing.

The surface graining of the aluminum plate is carried out by various methods, including mechanical surface roughening, electrochemical surface dissolving, or selective chemical surface dissolving. Mechanical surface graining includes ball graining, brush graining, blast graining, and buff graining. Electrochemical graining is carried out in an electrolytic solution containing hydrochloric acid or nitric acid with an alternating or direct current. Mechanical graining and electrochemical graining can be used in combination as taught in JP-A-54-63902. Prior to surface graining, the aluminum plate may be degreased with a surface active agent, an organic solvent, an alkali aqueous solution, etc. to remove rolling oil off the surface.

The surface grained aluminum plate is preferably immersion treated with a sodium silicate aqueous solution. As suggested in JP-B-47-5125, it is preferable to use an aluminum support prepared by the surface graining, followed by anodizing, followed by the treatment with an alkali metal silicate aqueous solution. Anodizing is carried out by, for example, electrolysis in an aqueous or nonaqueous electrolytic solution of one or more than one of inorganic acids, such as phosphoric acid, chromic acid, sulfuric acid, and nitric acid, and organic acids, such as oxalic acid and sulfamic acid, by using the aluminum plate as an anode.

Silicate electrodeposition as taught in U.S. Pat. No. 3,658,662 is also an effective surface treatment. A combination of the electrolytic graining techniques disclosed in JP-B-46-27481, JP-A-52-58602, and JP-A-52-30503 and the above-described anodizing and sodium silicate treatment is also useful. A support prepared by subjecting a metal plate to mechanical graining, chemical etching, electrolytic graining, anodizing, and sodium silicate treatment in this order is also suited.

A support prepared by applying to a support having been surface treated as described above a water-soluble resin, such as polyvinylphosphonic acid, a mono- or copolymer having a sulfo group in the side chain or polyacrylic acid, a water-soluble metal salt (e.g., zinc borate), a yellow dye, an amine salt, and the like to form a primer layer is also suitable. A support having a functional group capable of addition reaction by a radical covalently-bonded thereto by sol-gel processing as disclosed in Japanese Patent 3223222 is also preferably used.

A support having a water-resistant hydrophilic layer as a surface layer on an arbitrary support is also preferred. The hydrophilic surface layer includes a layer comprising an inorganic pigment and a binder according to U.S. Pat. No. 3,055,295 and JP-A-56-13168, a hydrophilic swellable layer described in JP-A-9-80744, and a sol-gel film comprising titanium oxide, polyvinyl alcohol and a silicate disclosed in JP-T-8-507727. Such hydrophilizing treatments are performed for the purpose of not only rendering the support surface water-wettable but preventing undesired reactions of the photopolymerizable composition provided on the support and improving adhesion of the photosensitive layer.

In the production of a lithographic printing plate by scanning exposure, which generally involves exposure of a plate precursor in the atmosphere, a protective layer can be provided on the photosensitive layer (photopolymerizable composition layer). A protective layer will protect the photosensitive layer against the attack of low-molecular compounds present in the air, such as basic substances, that might interfere with an imaging reaction induced by exposure and will thereby enable exposure in the atmosphere. Accordingly, the protective layer is required primarily to have low permeability to low-molecular compounds, and desirably, to cause substantially no hindrance to transmission of exposure light, to have good adhesion to the photosensitive layer, and to be easily removable in the development step after exposure. Devices regarding such a protective layer have hitherto been proposed as described in detail in U.S. Pat. No. 3,458,311 and JP-A-55-49729. To make up a protective layer, it is advisable to use water-soluble polymers which have relatively excellent crystallinity, such as polyvinyl alcohol, polyvinylpyrrolidone, acidic celluloses, gelatin, gum arabic, and polyacrylic acid. Use of polyvinyl alcohol as a main component produces the most satisfactory results for basic requirements, such as oxygen barrier properties and removability by development. The polyvinyl alcohol used to form a protective layer may be partially esterified, etherified or acetalized or partially copolymerized with other units as long as it contains an unsubstituted vinyl alcohol unit contributory to oxygen barrier properties and water solubility. Examples of useful polyvinyl alcohols are those having a degree of hydrolysis of 71 to 100 mol % and a weight average molecular weight of 300 to 2400, which are available on the market under trade names of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8, all supplied from Kurary Co., Ltd.

The components making up the protective group (e.g., PVAS and additives) should be selected with due consideration for not only the barrier properties against low-molecular compounds and removability by development but anti-fogging properties, adhesion to the photosensitive layer, and scratch resistance. In general, use of a PVA having a higher degree of hydrolysis (a higher content of the unsubstituted vinyl alcohol unit) and/or a higher protective layer thickness result in higher barrier properties against low-molecular substances, which are advantageous for sensitivity. However, too high low-molecular substances-barrier properties can cause unnecessary polymerization reaction during the production or storage of printing plate precursors or unnecessary fog and thickening of line images on imagewise exposure. Adhesion to the photosensitive layer and scratch resistance are also very important properties to be taken into consideration for handling the resulting printing plate precursors. A hydrophilic layer of a water-soluble polymer formed on an oleophilic polymer layer is liable to come off due to insufficient adhesion. Various proposals have been made to improve the adhesion between these two layers. For example, U.S. Pat. Nos. 292,501 and 44,563 teach that a hydrophilic polymer mainly comprising polyvinyl alcohol and containing 20 to 60% by weight of an acrylic emulsion or a water-insoluble vinylpyrrolidone-vinyl acetate copolymer, etc. provides a layer with sufficient adhesion to a polymer layer. Any of these known techniques can be applied to the protective layer formation in the invention. As for methods of coating to form a protective layer, the details are given, e.g., in U.S. Pat. No. 3,458,311 and JP-A-55-49729.

The protective layer can be designed to serve for additional functions. For example, in using a laser as an exposure light source, there are cases in which the photosensitive layer is required to have high sensitivity at the wavelength of the laser light and to have no sensitivity at other wavelengths. In an example, a lithographic printing plate precursor sensitive to infrared light of 750 nm or longer wavelength can be handled in practice in daylight but sometimes responds to short wavelength light from, e.g., fluorescent lamps. In such cases, a colorant (e.g., a water-soluble dye) which transmits the light of the light source while efficiently absorbing light of wavelengths shorter than 700 nm can be incorporated into the protective layer. In another example, a lithographic printing plate precursor sensitive to ultraviolet light of 450 nm or shorter wavelength can be handled in practice under room illumination but sometimes responds to visible light of 500 nm or longer. In such cases, a colorant (e.g., water-soluble dye) which transmits the light of the light source while efficiently absorbing light of wavelengths longer than 500 nm can be incorporated into the protective layer to improve room illumination suitability without reducing the sensitivity.

Where a photosensitive material having a photosensitive layer comprising the photopolymerizable composition of the invention is used as an image-forming material, an image is generally formed by imagewise exposing the photosensitive layer and removing the unexposed area of the photosensitive layer with a developer. A preferred developer for lithographic platemaking (plate developer) includes the one described in JP-B-57-7427, i.e., an aqueous solution of an inorganic alkali, such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, or aqueous ammonia, or an organic alkali, such as monoethanolamine or diethanolamine. The concentration of aqueous alkali solution is usually 0.1 to 10% by weight, preferably 0.5 to 5% by weight.

If desired, the aqueous alkali solution can contain a small amount of a surface active agent or an organic solvent, such as benzyl alcohol, 2-phenoxyethanol or 2-butoxyethanol. Such a developer includes the one described in U.S. Pat. Nos. 3,375,171 and 3,615,480.

The developers described in JP-A-50-26601, JP-A-58-54341, JP-B-56-39464, and JP-B-56-42860 are also preferred.

If desired, the platemaking process using the photopolymerizable composition may involve heating the entire area before or during exposure or after exposure and before development. The overall heating accelerates the image forming reaction in the photosensitive layer to improve sensitivity or press life and to stabilize the sensitivity. For the purpose of improving the image strength (i.e., press life), it is also effective to heat or expose the entire image area after development. The heating before development is usually preferably carried out under mild conditions of 150° C. or lower. Too high heating temperatures can fog even the nonimage area (unexposed area). The heating after development (baking) is carried out under very strong conditions, usually at temperatures ranging 200 to 500° C. Too low baking temperatures will fail to produce a sufficient image strengthening effect, and too high baking temperatures can cause deterioration of the support or thermal decomposition of the image area.

Imagewise exposure of the lithographic printing plate precursor for scanning exposure is conducted by any known technique. Lasers are preferred light sources. Available lasers emitting light of 350 to 450 nm include gas lasers, such as an Ar ion laser (364 nm or 351 nm, 10 mW to 1 W), a Kr ion laser (356 nm or 351 nm, 10 mW to 1 W), and an He—Cd laser (441 nm or 325 nm, 1 to 100 mW); solid state lasers, such as a combination of Nd:YAG ($YVO_4$) and two SHG crystals (355 nm, 5 mW to 1 W) and a combination of Cr:LiSAF and an SHG crystal (430 nm, 10 mW); semiconductor lasers, such as a $KNbO_3$ ring resonator (430 nm, 30 mW), a combination of a waveguide type wavelength convertor and AlGaAs/InGaAs semiconductor (380 to 450 nm, 5 to 100 mW), a combination of a waveguide type wavelength convertor and AlGaInP/AlGaAs semiconductors (300 to 350 nm, 5 to 100 mW), and AlGaInN (350 to 450 nm, 5 to 30 mW); and pulse lasers, such as an $N_2$ laser (337 nm, 0.1 to 10 mJ/pulse) and XeF (351 nm, 10 to 250 mJ/pulse). AlGaInN semiconductor lasers (commercially available InGaN-based semiconductor lasers: 400 to 410 nm, 5 to 30 mW) are particularly preferred for their wavelength characteristics and for economical consideration.

Available lasers emitting light of 450 to 700 nm include an Ar+ laser (488 nm), a YAG-SHG laser (532 nm), an He—Ne laser (633 nm), an He—Cd laser, and red semiconductor lasers (650 to 690 nm). Available lasers emitting light of 700 to 1200 nm include semiconductor lasers (800 to 850 nm) and an Nd-YAG laser (1064 nm).

Other usable light sources include ultrahigh-, high-middle- or low-pressure mercury lamps, chemical lamps, carbon arc lamps, xenon lamps, metal halide lamps, ultraviolet laser lamps (e.g., ArF excimer laser and KrF excimer laser), electron beams, X-rays, ion beams, and far infrared rays. From the economical viewpoint, the aforementioned lasers of 350 nm or longer wavelengths are preferred.

The exposing mechanism includes an internal drum system, an external drum system, and a flat bed system. Where the photosensitive layer composition of a lithographic printing plate precursor is designed to be soluble in neutral water or weakly alkaline water by choosing highly water-soluble materials, the plate precursor can be processed by on-press exposure and development.

Applications of the photopolymerizable composition of the present invention include not only fabrication of lithographic printing plate precursors for scanning exposure but wide applications known for photo-curing resins. For example, a liquid composition comprising the photopolymerizable composition and, if desired, a cation polymerizable compound provides a high-sensitivity stereolithographic material. The photopolymerizable composition can be designed to be a holographic material taking advantage of refractive index change on curing, or to be a variety of transfer materials (e.g., peel type light-sensitive materials and toner-developable light-sensitive materials) taking advantage of surface tackiness change on curing. The photopolymerizable composition is also applicable to photocuring of microcapsules, production of electronic materials such as photoresists, and production of photo-curing resin materials for inks, coatings, and adhesives.

EXAMPLES

The present invention will now be illustrated in greater detail with reference to Examples, but it should be understood that the invention is not construed as being limited thereto. Unless otherwise noted, all the percents and parts are by weight.

Polymers having the unit (I) were synthesized according to the following scheme:

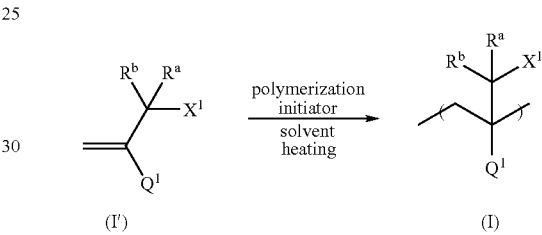

Formula (I') in the scheme represents a monomer providing the unit (I). In synthesis examples below, a compound number followed by (I') (e.g., compound P-2(I')) means a monomer which provides the unit (I) of the corresponding polymeric compound (e.g., compound P-2).

Synthesis of Monomer of Formula (I'):

Compounds of formula (I') were easily synthesized from corresponding acrylic group-containing compounds according to the method described in *Secchaku-no-Gijutsu*, 14(4), 1995, 2.

Synthesis of Polymer P-3 Having Unit (I):

(1) Synthesis of XP-1 (Precursor of Polymer P-3)

In a flask equipped with a condenser and a stirrer, 0.7 mol of compound XP-1(I'), 0.3 mol of methacrylic acid, 0.02 mol of an azo type thermal polymerization initiator (V-65, available from Wako Pure Chemical), and 1 liter of N,N-dimethylacetamide were mixed by stirring at 70° C. for 5 hours. After completion of the reaction, the reaction mixture was slowly poured in 5 liters of water while stirring, whereupon white powder precipitated. The precipitate was collected by filtration and dried to give XP-1 in a yield of 90%. The structure of the product was confirmed by NMR, IR, and GPC analyses.

(2) Synthesis of Polymer P-3

In a flask equipped with a condenser and a stirrer, 1.0 mol of polymeric compound XP-1 and p-methoxyphenol (0.001 mol) were dissolved in 1 liter of N,N-dimethylacetamide. To the solution was added dropwise 0.5 mol of 1,8-diazabicyclo[5.4.1]-7-undecene through a dropping funnel. After the mixture was stirred at room temperature for 30 minutes, 0.5 mol of 2-bromoethylmethacrylate was added thereto dropwise, followed by stirring at 60° C. for 8 hours. After cooling to room temperature, the reaction mixture was slowly added to 5 liters of water while stirring, whereupon white powder precipitated, which was collected by filtration and dried to give polymer P-3 in a yield of 80%. The structure of the polymer was confirmed through NMR, IR, and GPC analyses.

All the other polymers listed supra can be synthesized in the same manner as described above.

Example 1

1) Preparation of Support

A 0.3 mm thick aluminum plate was chemically etched by immersion in a 10% sodium hydroxide aqueous solution at 60° C. for 25 seconds, washed with running water, neutralized with 20% nitric acid, and washed with water. The thus grained aluminum plate was further grained by electrolysis in 1% nitric acid by using a sine-wave alternating current at an electricity quantity of 300 C/dm² at the anode. The surface grained aluminum plate was immersed in a 1% sodium hydroxide aqueous solution at 40° C. for 5 seconds and then desmutted in 30% sulfuric acid at 60° C. for 40 seconds. The resulting aluminum plate was anodized in a 20% sulfuric acid at a current density of 2 A/dm² for 2 minutes to form an anodic oxide film of 2.7 g/m². The surface roughness of the resulting aluminum support was 0.3 µm in terms of Ra (JIS B0601).

A back coating composition prepared as described below was applied to the reverse side of the aluminum support with a bar coater and dried at 100° C. for 1 minute to form a back coat having a coating weight of 70 mg/m².

Sol-gel Reaction Mixture:

| | |
|---|---|
| Tetraethyl silicate | 50 parts |
| Water | 20 parts |
| Methanol | 15 parts |
| Phosphoric acid | 0.05 part |

The above components were mixed and stirred. Heat generation started in about 5 minutes. After 60 minute-reaction, a mixture consisting of the following components was added to the reaction mixture to prepare a back coating composition.

| | |
|---|---|
| Pyrogallol formaldehyde condensed resin (molecular weight: 2000) | 4 parts |
| Dimethyl phthalate | 5 parts |
| Fluorine-containing surface active agent (N-butylperfluorooctanesulfonamidoethyl acrylate/polyoxyethylene acrylate copolymer; molecular weight: 20,000) | 0.7 part |
| Methanol silica sol (available from Nissan Chemical Industries, Ltd.; methanol content: 30%) | 50 parts |
| Methanol | 800 parts |

2) Formation of Photosensitive Layer

A photopolymerizable composition shown below was applied to the backcoated aluminum support to a dry thickness of 1.5 g/m² and dried at 100° C. for 1 minute to form a photosensitive layer.

Photosensitive Composition:

| | |
|---|---|
| Polymer X (see Table 4) | 2.0 g |
| Photopolymerization initiator Y (see Table 4) | 0.3 g |
| Polymerizable compound R (see Table 4) | 2.5 g |
| Additive S (see Table 4) | 0.4 g |
| Fluorine-containing surface active agent (Megafac F-177 available from Dainippon Ink & Chemicals, Inc.) | 0.03 g |
| Thermal polymerization inhibitor (N-nitrosophenylhydroxylamine aluminum salt) | 0.01 g |
| Pigment dispersion* | 2.0 g |
| *Pigment Blue 15:6 | 15 parts |
| Allyl methacrylate/methacrylic acid copolymer (83/17 by mole) | 10 parts |
| Cyclohexanone | 15 parts |
| Methoxypropyl acetate | 20 parts |
| Propylene glycol monomethyl ether | 40 parts |
| Methyl ethyl ketone | 20 g |
| Propylene glycol monomethyl ether | 20 g |

3) Formation of Protective Layer

Some of the photosensitive layers prepared above were coated with a 3% aqueous solution of polyvinyl alcohol (degree of saponification: 98 mol %; degree of polymerization: 550) to a dry coating thickness of 2 g/m² and dried at 100° C. for 2 minutes to form a protective layer.

4) Evaluation on Sensitivity

The resulting lithographic printing plate precursors were evaluated for sensitivity to light the wavelength of which was selected according to the exposure wavelength as shown in Table 4. That is, the printing plate precursor was exposed to light of a semiconductor laser of 400 nm, an FD-YAG laser of 532 nm or a semiconductor laser of 830 nm in the atmosphere. The exposed printing plate precursor was developed by immersion in a plate developer having the following formulation at 25° C. for 10 seconds. The minimum exposure energy (mJ/cm²) for image reproduction under the respective exposure conditions was taken as a parameter of sensitivity. The smaller the minimum exposure energy, the higher the sensitivity. The results obtained are shown in Table 5. Note that a difference in light source wavelength leads to a difference in energy quantity per photon, and it is natural that a photosensitive layer should show higher sensitivity to a shorter wavelength (i.e., the minimum exposure energy decreases with shortening of the exposure wavelength). Accordingly, comparing sensitivities between photosensitive layers exposed under different wavelength conditions is meaningless. The sensitivity data given in Table 5 should be used only for comparison between samples exposed under the same wavelength condition.

Plate Developer Formulation:

| | |
|---|---|
| DP-4 (available from Fuji Photo Film) | 65.0 g |
| Water | 880.0 g |
| Lipomin LA (amphoteric surfactant available from Lion Corp.; 20% aqueous solution) | 50.0 g |

5) Evaluation on Press Life

The printing plate precursors were exposed by scanning with the respective lasers to form 1% half tone dots (highlight), heated on a panel heater at 120° C. for 20 seconds, and developed with the same plate developer used above. The resulting printing plate was set on a printing machine Heidel KORD to carry out printing. The number of impressions from one plate, taken as a parameter of press life, was expressed relatively, taking the impressions of Comparative Example 1 as 100. The greater, the impressions, the longer the press life. The results obtained are shown in Table 5.

6) Evaluation of Storage Stability

The printing plate precursor was allowed to stand at 60° C. for 3 days and then subjected to the same platemaking steps as described above. The storage stability of the plate precursor was evaluated from a ratio of exposure energy necessary for imaging after the standing to that before the standing. Energy ratios of 1.1 or smaller are preferred for the production and can also be seen as indicative of satisfactory storage stability. The results obtained are shown in Table 5.

TABLE 4

| | X | Y | R | S | Protective Layer | Light Source (nm) |
|---|---|---|---|---|---|---|
| Ex. 1 | P-1 | Y-1 | R-1 | — | yes | 400 |
| Ex. 2 | P-3 | Y-1 | R-1 | — | yes | 400 |
| Ex. 3 | P-6 | Y-2 | R-2 | S-1 | yes | 400 |
| Ex. 4 | P-7 | Y-2 | R-2 | — | yes | 400 |
| Ex. 5 | P-9 | Y-1 | R-3 | S-3 | yes | 400 |
| Ex. 6 | P-11 | Y-2 | R-3 | S-4 | yes | 400 |
| Ex. 7 | P-16 | Y-2 | R-1 | S-2 | yes | 400 |
| Ex. 8 | P-19 | Y-2 | R-1 | — | yes | 400 |
| Ex. 9 | P-20 | Y-1 | R-2 | S-1 | yes | 400 |
| Comp. Ex. 1 | XP-1 | Y-1 | R-1 | — | yes | 400 |
| Comp. Ex. 2 | XP-3 | Y-1 | R-1 | — | yes | 400 |
| Comp. Ex. 3 | XP-6 | Y-2 | R-2 | S-1 | yes | 400 |
| Comp. Ex. 4 | XP-7 | Y-2 | R-2 | — | yes | 400 |
| Comp. Ex. 5 | XP-9 | Y-1 | R-3 | S-3 | yes | 400 |
| Comp. Ex. 6 | XP-11 | Y-2 | R-3 | S-4 | yes | 400 |
| Comp. Ex. 7 | XP-16 | Y-2 | R-1 | S-2 | yes | 400 |
| Comp. Ex. 8 | XP-19 | Y-2 | R-1 | — | yes | 400 |
| Comp. Ex. 9 | XP-20 | Y-1 | R-2 | S-1 | yes | 400 |
| Ex. 10 | P-1 | Y-3 | R-1 | — | yes | 532 |
| Ex. 11 | P-3 | Y-3 | R-1 | — | yes | 532 |
| Ex. 12 | P-6 | Y-4 | R-1 | S-1 | yes | 532 |
| Ex. 13 | P-7 | Y-4 | R-3 | S-2 | yes | 532 |
| Ex. 14 | P-9 | Y-5 | R-3 | S-3 | yes | 532 |
| Ex. 15 | P-11 | Y-4 | R-3 | S-4 | yes | 532 |
| Ex. 16 | P-16 | Y-4 | R-2 | S-2 | yes | 532 |
| Ex. 17 | P-19 | Y-3 | R-2 | — | yes | 532 |
| Comp. Ex. 10 | XP-1 | Y-3 | R-1 | — | yes | 532 |
| Comp. Ex. 11 | XP-3 | Y-3 | R-1 | — | yes | 532 |
| Comp. Ex. 12 | XP-6 | Y-4 | R-1 | S-1 | yes | 532 |
| Comp. Ex. 13 | XP-7 | Y-4 | R-3 | S-2 | yes | 532 |
| Comp. Ex. 14 | XP-9 | Y-5 | R-3 | S-3 | yes | 532 |
| Comp. Ex. 15 | XP-11 | Y-4 | R-3 | S-4 | yes | 532 |
| Comp. Ex. 16 | XP-16 | Y-4 | R-2 | S-2 | yes | 532 |
| Comp. Ex. 17 | XP-19 | Y-3 | R-2 | — | yes | 532 |
| Ex. 18 | P-1 | Y-5 | R-2 | — | no | 830 |
| Ex. 19 | P-3 | Y-6 | R-2 | — | no | 830 |
| Ex. 20 | P-6 | Y-6 | R-1 | S-5 | no | 830 |
| Ex. 21 | P-7 | Y-7 | R-2 | S-5 | no | 830 |
| Ex. 22 | P-9 | Y-7 | R-2 | S-6 | no | 830 |
| Ex. 23 | P-11 | Y-8 | R-1 | S-7 | no | 830 |
| Ex. 24 | P-16 | Y-8 | R-2 | — | no | 830 |
| Ex. 25 | P-19 | Y-9 | R-2 | — | no | 830 |
| Comp. Ex. 18 | XP-1 | Y-5 | R-2 | — | no | 830 |
| Comp. Ex. 19 | XP-3 | Y-6 | R-2 | — | no | 830 |
| Comp. Ex. 20 | XP-6 | Y-6 | R-1 | S-5 | no | 830 |
| Comp. Ex. 21 | XP-7 | Y-7 | R-2 | S-5 | no | 830 |
| Comp. Ex. 22 | XP-9 | Y-7 | R-2 | S-6 | no | 830 |
| Comp. Ex. 23 | XP-11 | Y-8 | R-1 | S-7 | no | 830 |
| Comp. Ex. 24 | XP-16 | Y-8 | R-2 | — | no | 830 |
| Comp. Ex. 25 | XP-19 | Y-9 | R-2 | — | no | 830 |

TABLE 5

| | Press Life (Impressions) | Storage Stability | Sensitivity (mJ/cm$^2$) |
|---|---|---|---|
| Ex. 1 | 200 | 1.1 | 0.05 |
| Ex. 2 | 250 | 1.05 | 0.04 |
| Ex. 3 | 200 | 1.1 | 0.05 |
| Ex. 4 | 200 | 1.1 | 0.05 |
| Ex. 5 | 200 | 1.1 | 0.05 |
| EX. 6 | 250 | 1.05 | 0.04 |
| Ex. 7 | 250 | 1.05 | 0.04 |
| Ex. 8 | 200 | 1.1 | 0.05 |
| Ex. 9 | 200 | 1.1 | 0.05 |
| Comp. Ex. 1 | 100 | 3.0 | 0.1 |
| Comp. Ex. 2 | 120 | 2.0 | 0.1 |
| Comp. Ex. 3 | 100 | 3.5 | 0.1 |
| Comp. Ex. 4 | 120 | 2.0 | 0.1 |
| Comp. Ex. 5 | 110 | 1.5 | 0.09 |
| Comp. Ex. 6 | 130 | 3.5 | 0.1 |
| Comp. Ex. 7 | 130 | 2.0 | 0.1 |
| Comp. Ex. 8 | 120 | 3.5 | 0.1 |
| Comp. Ex. 9 | 120 | 4.5 | 0.1 |
| Ex. 10 | 180 | 1.1 | 0.1 |
| Ex. 11 | 210 | 1.05 | 0.08 |
| Ex. 12 | 190 | 1.1 | 0.1 |
| Ex. 13 | 190 | 1.1 | 0.1 |
| Sx. 14 | 190 | 1.1 | 0.1 |
| Ex. 15 | 200 | 1.1 | 0.08 |
| Ex. 16 | 200 | 1.05 | 0.08 |
| Ex. 17 | 200 | 1.1 | 0.1 |
| Comp. Ex. 10 | 90 | 3.0 | 0.15 |
| Comp. Ex. 11 | 100 | 2.5 | 0.12 |
| Comp. Ex. 12 | 100 | 3.5 | 0.15 |
| Comp. Ex. 13 | 100 | 2.0 | 0.12 |
| Comp. Ex. 14 | 100 | 2.5 | 0.12 |
| Comp. Ex. 15 | 110 | 3.0 | 0.15 |
| Comp. Ex. 16 | 100 | 2.0 | 0.12 |
| Comp. Ex. 17 | 120 | 4.0 | 0.20 |
| Ex. 18 | 160 | 1.1 | 80 |
| Ex. 19 | 180 | 1.05 | 70 |
| Ex. 20 | 160 | 1.1 | 80 |
| Ex. 21 | 150 | 1.1 | 80 |
| Ex. 22 | 180 | 1.1 | 80 |
| Ex. 23 | 180 | 1.05 | 70 |
| Ex. 24 | 190 | 1.05 | 70 |
| Ex. 25 | 160 | 1.1 | 80 |
| Comp. Ex. 18 | 70 | 2.0 | 100 |
| Comp. Ex. 19 | 80 | 3.0 | 100 |
| Comp. Ex. 20 | 90 | 3.0 | 90 |
| Comp. Ex. 21 | 100 | 2.0 | 90 |
| Comp. Ex. 22 | 100 | 1.5 | 100 |
| Comp. Ex. 23 | 70 | 3.5 | 90 |
| Comp. Ex. 24 | 80 | 1.5 | 100 |
| Comp. Ex. 25 | 90 | 2.0 | 90 |

The compounds used in Examples are shown below.
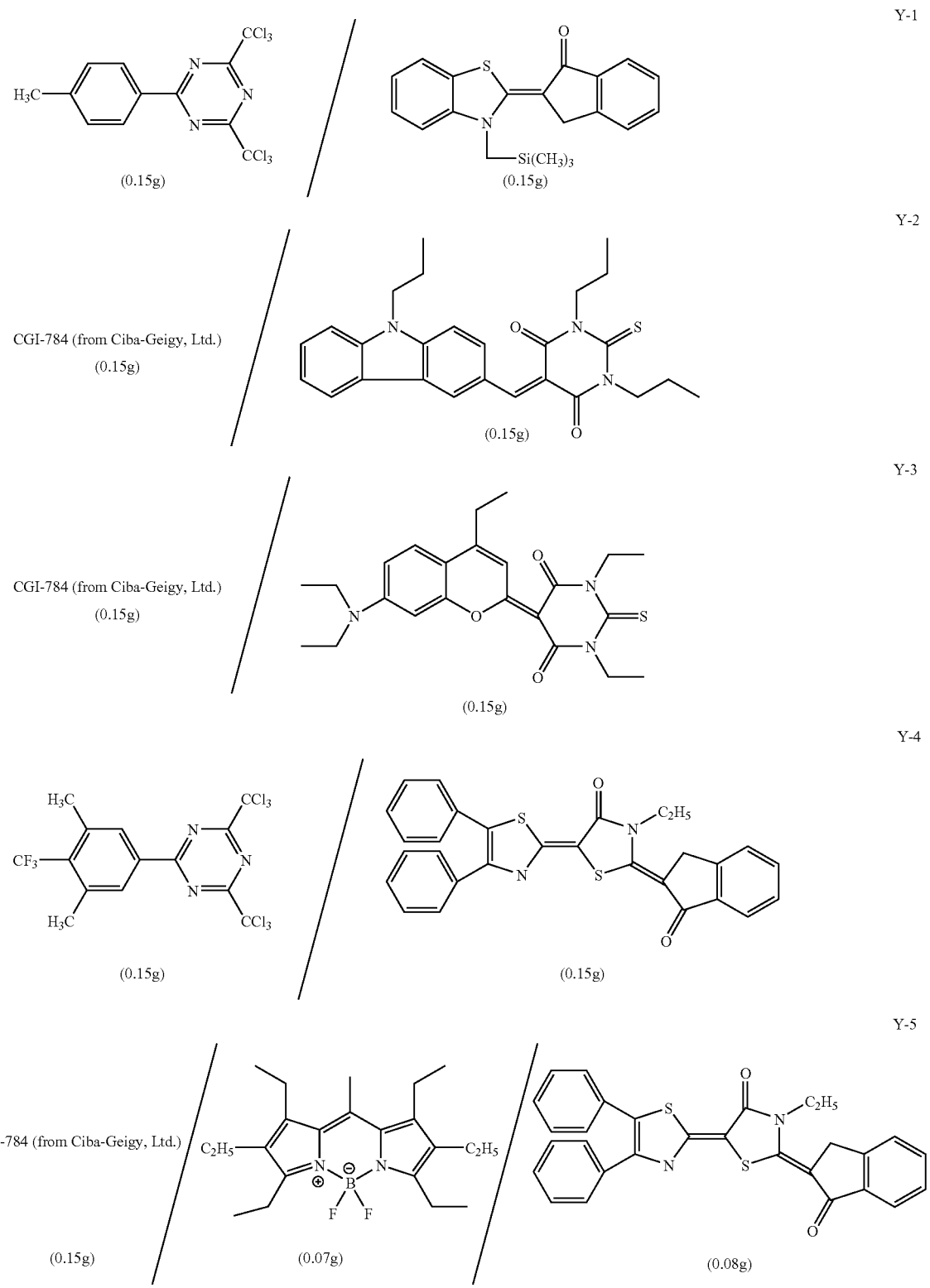
R-1: Pentaerythritol tetraacrylate
R-2: Dipentaerythritol hexaacrylate -continued
R-3:
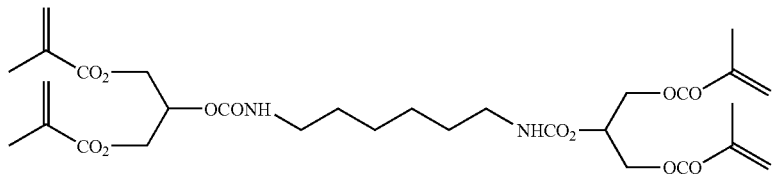
S-1
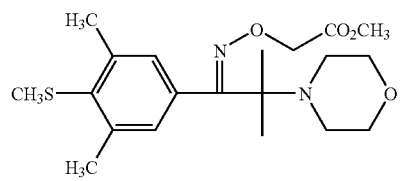
S-2
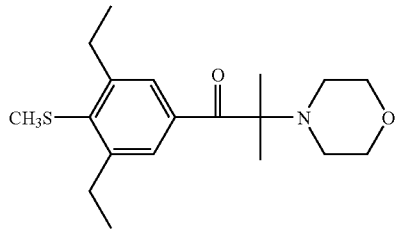
S-3
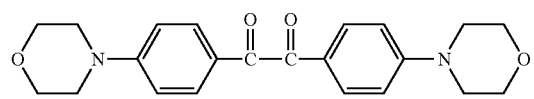
S-4
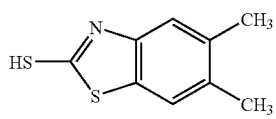
S-5
$((n)C_4H_9)_4N^{\oplus} \cdot PF_6^{\ominus}$
S-6
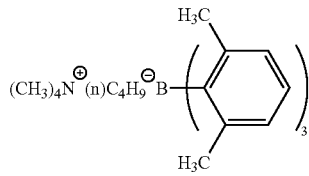
S-7
Y-6

-continued
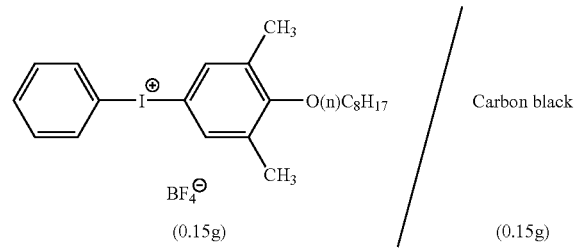
(0.15g) / Carbon black (0.15g)
Y-7
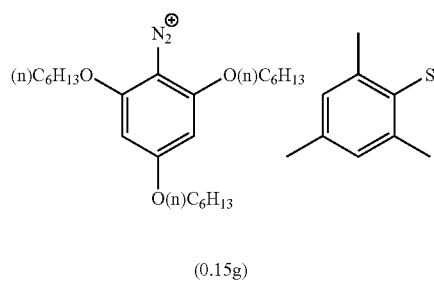
(0.15g)
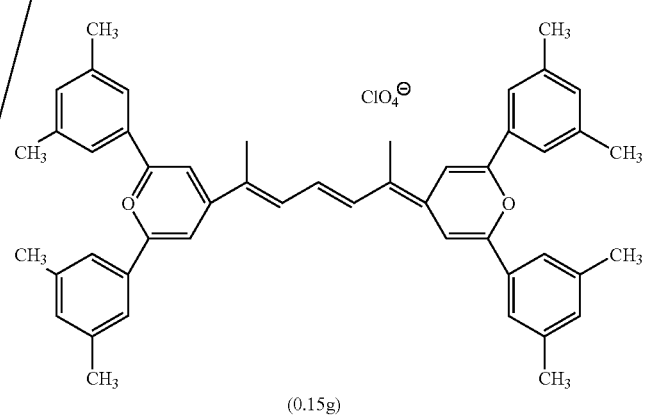
(0.15g)
Y-8
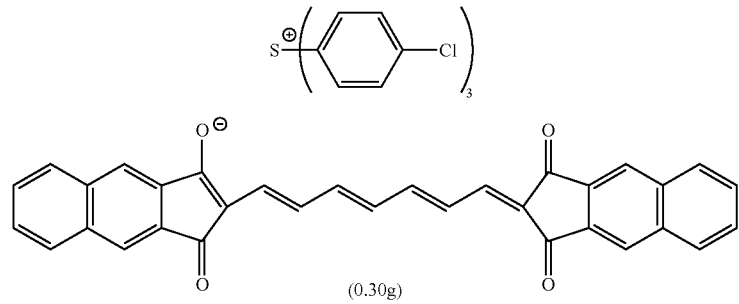
(0.30g)
Y-9
Comparative Polymers:
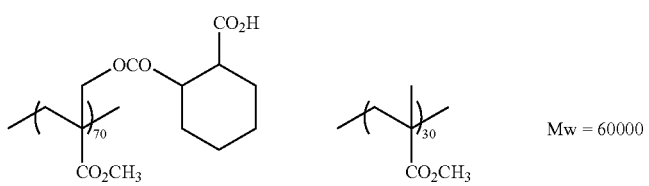
Mw = 60000
XP-1
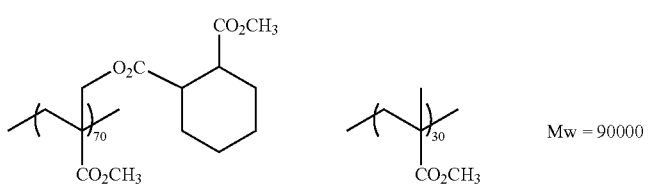
Mw = 90000
XP-3

-continued

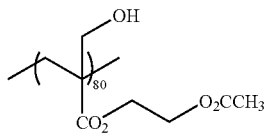 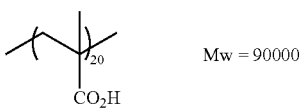 XP-6

Mw = 90000

XP-7

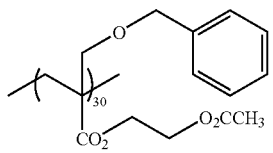 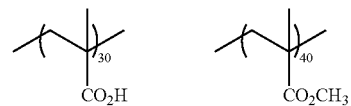 Mw = 60000

XP-9

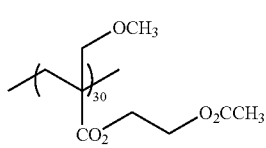 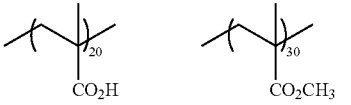 Mw = 100000

XP-11

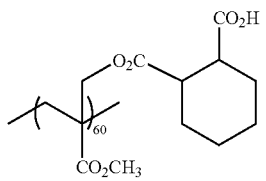 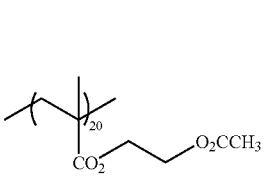 Mw = 50000

XP-16

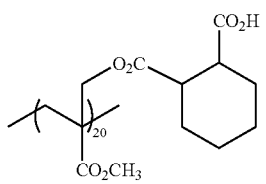 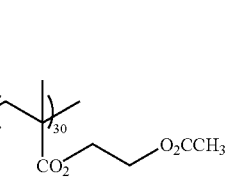 Mw = 100000

XP-19

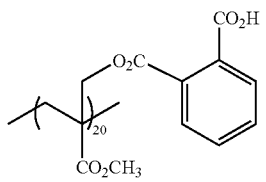 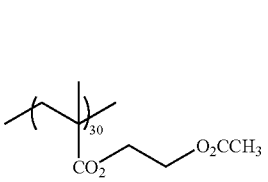 Mw = 90000

XP-20

Mw = 110000

The results in Table 5 prove that the photopolymerizable composition according to the invention forms a photosensitive layer with satisfactory storage stability and provides a lithographic printing plate having an extended press life. It is also seen that the photopolymerizable composition of the invention forms a photosensitive layer with higher sensitivity than that containing a polymer having no radical polymerizable group.

The present invention provides a photopolymerizable composition, particularly a photo-radical polymerizable composition that is promising in imaging technology for its highest sensitivity, which provides a photosensitive layer excellent in all of film strength, storage stability and sensitivity. The photopolymerizable composition of the invention is specially suited to fabricate a lithographic printing plate precursor capable of direct writing with a solid state laser or a semiconductor laser emitting ultraviolet light, visible right or infrared light based on digital data from computers, etc. The photopolymerizable composition therefore provides a lithographic printing plate precursor excellent in storage stability and sensitivity and a lithographic printing plate with an extended press life.

This application is based on Japanese Patent application JP 2002-55881, filed Mar. 1, 2002, the entire content of which is hereby incorporated by reference, the same as if set forth at length.

What is claimed is:

1. A photopolymerizable composition comprising a polymer having a radical polymerizable group in a side chain and a unit represented by the following formula (I):

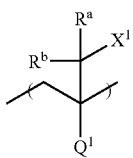

wherein $Q^1$ represents a cyano group or $COX^2$; $X^1$ represents a halogen atom or a linking group to which another substituent is bonded to form a hydroxyl group, a substituted oxy group, a mercapto group, a substituted thio group, an amino group, a substituted amino group, a sulfo group, a sulfonate group, a substituted sulfinyl group, a substituted sulfonyl group, a phosphono group, a substituted phosphono group, a phosphonate group, a substituted phosphonate group, a nitro group or a heterocyclic group bonded at the hetero atom thereof; $X^2$ represents a halogen atom or a linking group to which another substituent is bonded to form a hydroxyl group, a substituted oxy group, a mercapto group, a substituted thio group, an amino group, a substituted amino group or a heterocyclic group bonded at the hetero atom thereof; $R^a$ and $R^b$ each independently represent a hydrogen atom; $X^1$ and $X^2$ may be taken together to form a cyclic structure.

2. The photopolymerizable composition according to claim 1, which comprises a radical polymerizable group introduced into $X^1$.

3. The photopolymerizable composition according to claim 1, which comprises a radical polymerizable group introduced into $Q^1$.

4. The photopolymerizable composition according to claim 1, which comprises a radical polymerizable group introduced into a comonomer unit other than the unit represented by the formula (I).

5. The photopolymerizable composition according to claim 1, wherein the polymer comprises a comonomer unit having an alkali-soluble group.

6. The photopolymerizable composition according to claim 5, wherein the alkali-soluble group is a carboxyl group, a phenoxy group, or a sulfamoyl group.

7. The photopolymerizable composition according to claim 4, wherein the unit represented by the formula (I) comprises a cyclic structure.

8. The photopolymerizable composition according to claim 1, further comprising an infrared absorber having an absorption wavelengths of 700 to 1200 nm.

9. The photopolymerizable composition according to claim 1, further comprising an aromatic onium compound as a photopolymerization initiator.

10. The photopolymerizable composition according to claim 1, further comprising at least one of an aromatic sulfonium salt, an aromatic diazonium salt and an aromatic iodonium salt as a photopolymerization initiator.

11. The photopolymerizable composition according to claim 1, further comprising a metallocene compound as a photopolymerization initiator.

12. The photopolymerizable composition according to claim 1, further comprising a titanocene compound as a photopolymerization initiator.

13. The photopolymerizable composition according to claim 1, further comprising a visible light absorber having an absorption wavelengths of 350 to 700 nm.

14. An image forming method comprising image-wise exposing the photopolymerizable composition according to claim 1 using a semiconductor laser having a wavelength of 400 to 700 nm.

15. An image forming method comprising image-wise exposing the photopolymerizable composition according to claim 1 using a semiconductor laser having a wavelength of 800 to 850 nm.

* * * * *